(12) United States Patent
Uchimura et al.

(10) Patent No.: US 8,854,152 B2
(45) Date of Patent: Oct. 7, 2014

(54) HIGH-FREQUENCY MODULE INCLUDING A CONDUCTOR WITH A SLOT THEREIN AND A CONDUCTIVE WIRE CROSSING OVER THE SLOT AND PHYSICALLY CONTACTING THE CONDUCTOR

(75) Inventors: Hiroshi Uchimura, Kirishima (JP); Nobuki Hiramatsu, Soraku-gun (JP); Kazuki Hayata, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 326 days.

(21) Appl. No.: 13/201,836

(22) PCT Filed: Feb. 25, 2010

(86) PCT No.: PCT/JP2010/052984
§ 371 (c)(1),
(2), (4) Date: Aug. 16, 2011

(87) PCT Pub. No.: WO2010/098393
PCT Pub. Date: Sep. 2, 2010

(65) Prior Publication Data
US 2011/0298568 A1      Dec. 8, 2011

(30) Foreign Application Priority Data

Feb. 25, 2009  (JP) ................................. 2009-042002
Sep. 24, 2009  (JP) ................................. 2009-218509

(51) Int. Cl.
*H01P 5/10* (2006.01)
*H01P 5/107* (2006.01)
(Continued)

(52) U.S. Cl.
CPC .............. *H01P 5/107* (2013.01); *H01P 5/1015* (2013.01); *H01L 23/13* (2013.01);
(Continued)

(58) Field of Classification Search
CPC ................................................... H01P 5/1015

USPC .......................................... 333/26, 247, 21 R
See application file for complete search history.

(56) References Cited

U.S. PATENT DOCUMENTS 6,057,600 A * 5/2000 Kitazawa et al. ............. 257/728
6,127,901 A    10/2000 Lynch
(Continued)

FOREIGN PATENT DOCUMENTS

CN  1352815 A  6/2002
CN  1735999 A  2/2006
(Continued)

OTHER PUBLICATIONS

Chinese language office action dated Oct. 10, 2013 and its English language Concise Explanation issued in corresponding Chinese application 201080007077.1.

(Continued)

*Primary Examiner* — Benny Lee
(74) *Attorney, Agent, or Firm* — DLA Piper LLP (US)

(57) ABSTRACT

A high-frequency module includes a high-frequency component including a high-frequency circuit, a conductor plate including a slot, a first conductive wire, and two second conductive wires. The high-frequency component includes a signal terminal and two reference potential terminals. The signal terminal is used for at least one of input and output of a high-frequency signal. The two reference potential terminals are connected to a reference potential. The first conductive wire is connected to the signal terminal in terms of high-frequency. The first conductive wire crosses over above the slot. The two second conductive wires are connected to the two reference potential terminals in terms of high-frequency. The two second conductive wires are so disposed along the first conductive wire and do not cross over the slot. The first conductive wire and the two second conductive wires form a pair and are electromagnetically coupled to the slot.

13 Claims, 17 Drawing Sheets

(51) Int. Cl.
*H01L 23/66* (2006.01)
*H01P 3/12* (2006.01)
*H01Q 13/10* (2006.01)
*H01Q 23/00* (2006.01)
*H01L 23/13* (2006.01)
*H01L 23/00* (2006.01)

(52) U.S. Cl.
CPC ............... H01L 23/66 (2013.01); *H01L 24/45* (2013.01); H01L 24/49 (2013.01); *H01L 2223/6611* (2013.01); *H01L 2223/6627* (2013.01); *H01L 2224/45014* (2013.01); *H01L 2224/45015* (2013.01); *H01L 2224/45124* (2013.01); *H01L 2224/45144* (2013.01); *H01L 2224/48227* (2013.01); *H01L 2224/49175* (2013.01); *H01L 2224/49433* (2013.01); *H01L 2924/01005* (2013.01); *H01L 2924/01013* (2013.01); *H01L 2924/0102* (2013.01); *H01L 2924/01029* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01); *H01L 2924/1423* (2013.01); *H01L 2924/16152* (2013.01); *H01L 2924/1903* (2013.01); *H01L 2924/19051* (2013.01); *H01L 2924/20752* (2013.01); *H01L 2924/20758* (2013.01); *H01L 2924/30105* (2013.01); *H01L 2924/30107* (2013.01); *H01L 2924/3011* (2013.01); H01P *3/121* (2013.01); H01Q 13/10 (2013.01); H01Q 23/00 (2013.01); *H01L 24/48* (2013.01); *H01L 2924/01033* (2013.01)
USPC ........................... 333/21 R; 333/26; 333/247

(56) References Cited

U.S. PATENT DOCUMENTS

| | | | | |
|---|---|---|---|---|
| 6,356,173 | B1* | 3/2002 | Nagata et al. | 333/247 |
| 6,483,406 | B1* | 11/2002 | Sawa et al. | 333/247 |
| 2004/0155723 | A1* | 8/2004 | Koriyama | 333/26 |
| 2004/0203528 | A1 | 10/2004 | Ammar et al. | |

FOREIGN PATENT DOCUMENTS

| | | |
|---|---|---|
| DE | 19903183 A1 | 8/2000 |
| DE | 10350346 A1 | 10/2004 |
| JP | 2000-022043 | 1/2000 |
| JP | 2000-183611 | 6/2000 |
| JP | 2001-148457 | 5/2001 |
| JP | 2007-095838 | 4/2007 |

OTHER PUBLICATIONS

Chinese language office action dated May 3, 2013 and an English concise explanation issued in corresponding Chinese application 201080007077.1.

German language office action dated Apr. 22, 2013 and its English language translation issued in corresponding German application 112010000886.8.

\* cited by examiner

US 8,854,152 B2

HIGH-FREQUENCY MODULE INCLUDING A CONDUCTOR WITH A SLOT THEREIN AND A CONDUCTIVE WIRE CROSSING OVER THE SLOT AND PHYSICALLY CONTACTING THE CONDUCTOR

CROSS-REFERENCE TO THE RELATED APPLICATIONS

This application is a national stage of international application No. PCT/JP2010/052984, filed on Feb. 25, 2010, and claims the benefit of priority under 35 USC 119 to Japanese Patent Application No. 2009-042002, filed on Feb. 25, 2010 and Japanese Patent Application No. 2009-218509, filed on Sep. 24, 2009, the entire contents of all of which are incorporated herein by reference.

TECHNICAL FIELD

The present invention relates to a high-frequency module.

BACKGROUND ART

For a case where a semiconductor device such as MMIC (Monolithic Microwave Integrated Circuit) is mounted on a high-frequency circuit board, when a conductive wire such as a bonding wire is used to achieve connection for the mounting, an inductance component will arise depending on the line length of the conductive wire. The higher the frequency is, the more significant deterioration in transmission characteristics is due to this inductance component. In view of this, it has been customary to establish connection with a conductive wire such as a bonding wire that is as short as possible in a high-frequency region. There is a technique to place a semiconductor device inside a cavity formed in a high-frequency circuit board, and establish connection with a signal line around the cavity. This technique is described in, for example, Japanese Unexamined Patent Publication JP-A 2001-148457. In addition, there is a technique to cancel out impedance mismatch resulting from the inductance component with a newly introduced capacitance component. This technique is described in, for example, Japanese Unexamined Patent Publication JP-A 2007-95838. However, in the foregoing techniques, the resultant inductance component and the introduced capacitance component can vary even with a slight dimensional change. After all, in the foregoing techniques, high dimensional accuracy is required, and the problem is that proper matching becomes difficult at higher frequencies or that a band of frequencies at which matching can be achieved is narrow.

The invention has been devised in view of the problems associated with the conventional art as mentioned supra, and accordingly an object of the invention is to provide a high-frequency module capable of easy connection of a high-frequency circuit by means of a conductive wire.

SUMMARY OF THE INVENTION

Solution to the Problem

A high-frequency module according to the invention comprises: a high-frequency circuit; a conductor; a first conductive wire; and at least one second conductive wire. The high-frequency circuit comprises a signal terminal and at least one reference potential terminal. The signal terminal is used for at least one of input and output of a high-frequency signal. The at least one reference potential terminal is connected to a reference potential. The conductor comprises a slot. The first conductive wire is connected to the signal terminal. The first conductive wire crosses over above the slot. The at least one second conductive wire is connected to the at least one reference potential terminal. The at least one second conductive wire is so disposed that at least a part thereof extends alongside the first conductive wire. The at least one second conductive wire does not cross over above the slot. The first conductive wire and the at least one second conductive wire form a transmission line and are electromagnetically coupled to the slot.

Advantageous Effects of Invention

According to the invention, it is possible to provide a high-frequency module capable of easy connection of a high-frequency circuit by means of a conductive wire.

DETAIL DESCRIPTION OF THE PREFERRED EMBODIMENTS

Hereinafter, a high-frequency module according to the invention will be described in detail with reference to the accompanying drawings, where like features in the different drawing figures are denoted by the same reference label, and which may not be described in detail in each drawing figures in which it appears.

First Embodiment

Figure 1:
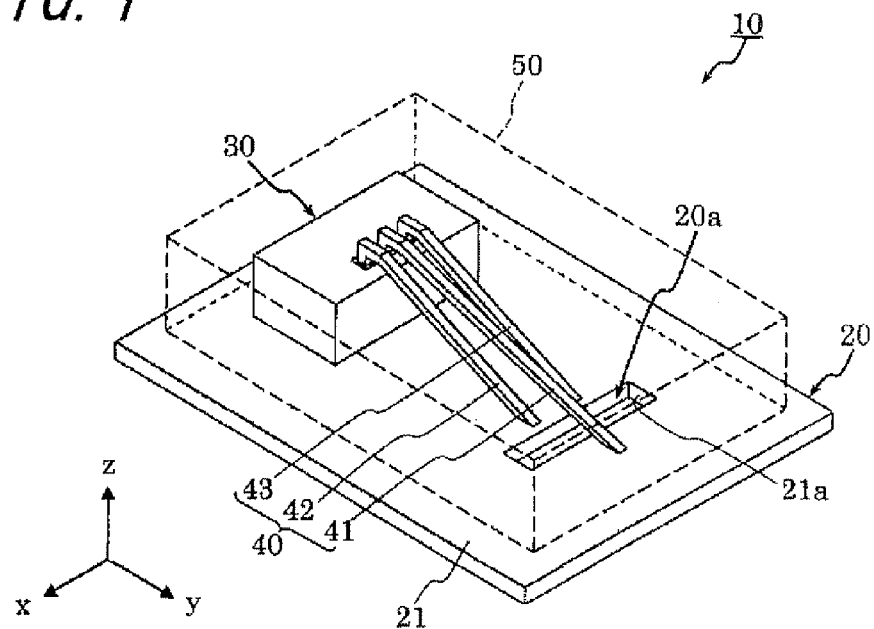
FIG. 1 is an external perspective view schematically showing a first embodiment of a high-frequency module according to the invention.
Figure 2:
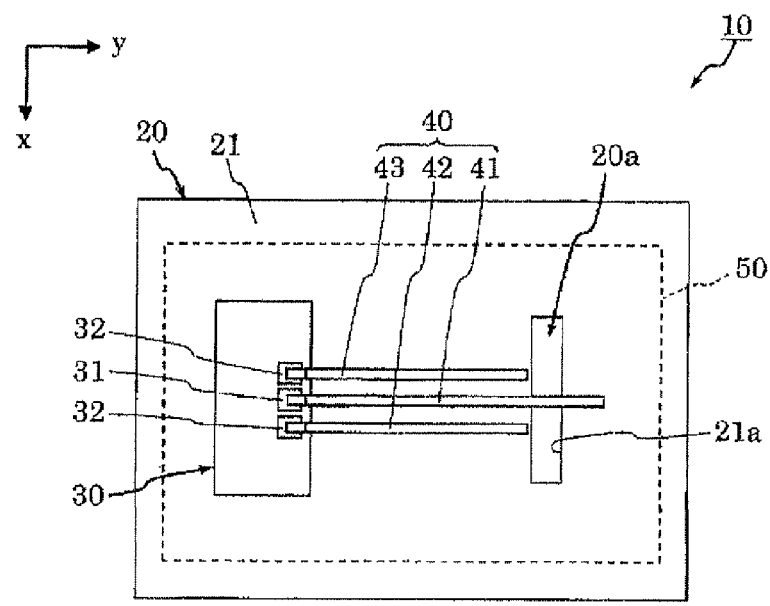
FIG. 2 is a plan view schematically showing the high-frequency module shown in FIG. 1.
Figure 3:
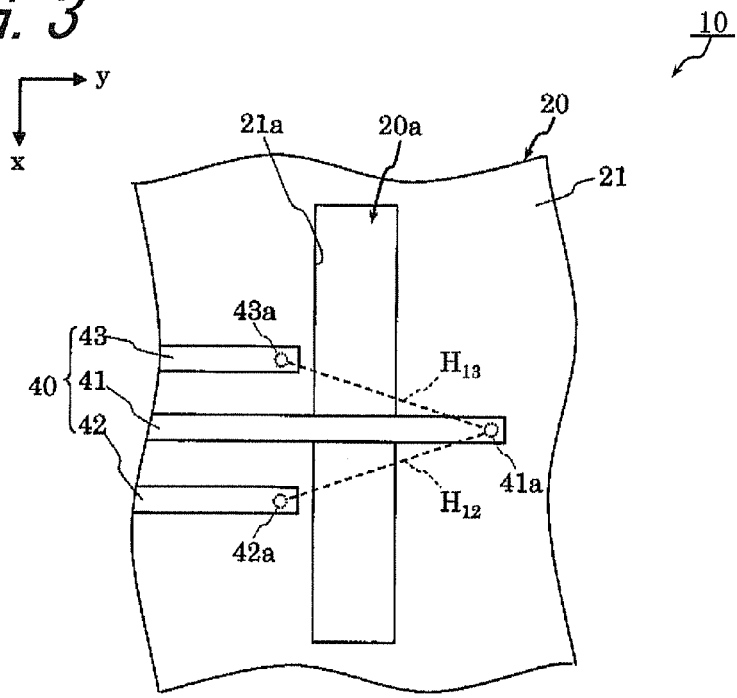
FIG. 3 is an enlarged plan view showing the main part of the high-frequency module shown in FIG. 2.

A high-frequency module 10 in accordance with a first embodiment as shown in FIGS. 1, 2, and 3 comprises a slot structure 20, a high-frequency component 30 (FIGS. 1, 2), a conductive wire 40, and a protection member 50 (FIGS. 1, 2).

The slot structure 20 of this embodiment is constructed of a conductor plate 21. The conductor plate 21 is made of an electrically conductive conductor having a widened plane surface. Examples of the "electrically conductive conductor" include gold, silver, copper, platinum, and alloys of such metal materials. The conductor plate 21 employed in this embodiment is rectangular-shaped in a plan view. As used herein, the term "plane surface" refers not only to a flat surface but also to a curved surface.

The conductor plate 21 has a through hole 21a. The through hole 21a is drilled all the way through between main surfaces of the conductor plate 21 in thickness direction. The conductor plate 21 is designed as a conductor having an annular portion with the through hole 21a as its center. The through hole 21a takes the form of a rectangle elongated in one direction within the main surface of the conductor plate 21. In this construction, the one direction in which the through hole 21a is elongated will be referred to as a first direction, and a direction aligned with the relatively short side of the through hole 21a will be referred to as a second direction. In this embodiment, the first direction is defined as an x direction, and the second direction is defined as a y direction for illustration in FIG. 1 and so forth. In this embodiment, the through hole 21a functions as a slot 20a for the passage of a high-frequency signal having a high frequency. In the slot 20a, an electric field is produced along the second direction. For example, the slot 20a is used as an antenna for spatial radiation. For example, the high-frequency signal is greater than or equal to $3 \times 10^9$ [Hz] in respect of frequency, and thus a microwave signal, a millimeter wave signal, and a sub-millimeter wave signal are included. In a case where the conductor plate 21 has a curved surface, the slot 20a extends in a curve correspondingly. Moreover, the length of the slot 20a in the first direction is set to be about one-half the wavelength of the high-frequency signal passing through the slot 20a. While the slot 20a is rectangular-shaped in this embodiment, it may have another shape such as an elliptical shape or a dumbbell shape.

The high-frequency component 30 includes a high-frequency circuit in which signal transmission is effected by means of a high-frequency signal. The high-frequency component 30 of this embodiment is placed on one of the main surfaces of the slot structure 20. The high-frequency component 30 of this embodiment comprises a signal terminal 31 and a reference potential terminal 32 as shown in FIG. 2. The signal terminal 31 and the reference potential terminal 32 are provided as connection terminals for the high-frequency circuit built in the high-frequency component 30.

The signal terminal 31 is used for at least one of input and output of a high-frequency signal. That is, the signal terminal 31 may be designed for use either in high-frequency signal input or in high-frequency signal output, or may be designed for use in high-frequency signal input and output. Moreover, the signal terminal 31 is electrically connected to the high-frequency circuit built in the high-frequency component 30. The signal terminal 31 of this embodiment is located on the upper surface of the high-frequency component 30.

The reference potential terminal 32 is electrically connected to a reference potential point in the high-frequency component 30. The reference potential terminal 32' is arranged next to the signal terminal 31. The reference potential terminal 32 is insulated from the signal terminal 31. In this embodiment, there are provided two reference potential terminals 32 that are spaced apart. The signal terminal 31 is interposed between the two reference potential terminals 32.

The conductive wire 40 provides electromagnetic coupling between the slot structure 20 and the high-frequency component 30. The conductive wire 40 includes a first conductive wire 41 and second conductive wires 42 and 43. A metal material such as gold and aluminum for example can be used for the first conductive wire 41 and the second conductive wires 42 and 43. For example, the first conductive wire 41 and the second conductive wires 42 and 43 ranging approximately from 0.01 to 0.05 [mm] in thickness are employed. The first conductive wire 41 and the second conductive wires 42 and 43 can be formed by using a wire bonding apparatus, for example. As used herein, the term "conductive wire" refers to a linear or a belt-like conductor. Examples of the belt-like conductor include a ribbon wire and the like. Moreover, the term "electromagnetic coupling" refers to transmission of a high-frequency signal by means of an electromagnetic wave.

The first conductive wire 41 provides electrical connection between the conductor plate 21 and the signal terminal 31. As used herein, the term "electrical connection" refers to a state of connection to permit transmission of a propagating high-frequency signal from a sending side to a receiving side. The "electrical connection" state is a point of view on the transmission of a high-frequency signal, which is construed as encompassing both a case where there is physical contact between the sending side and the receiving side and a case where no physical contact is established between the sending side and the receiving side. The first conductive wire 41 of this embodiment provides direct connection between the conductor plate 21 and the signal terminal 31. The first conductive wire 41 is connected at a first end thereof to the signal terminal 31. The first conductive wire 41 is connected at a second end 41a thereof to the conductor plate 21. The connection part at the second end 41a of the first conductive wire 41 is situated behind the slot 20a when viewed from the high-frequency component 30. The first conductive wire 41 is disposed to straddle over the slot 20a. More specifically, the first conductive wire 41 crosses over above, or upward the slot 20a with spacing away from the slot 20a. The "upward" direction corresponds to the direction of a normal with respect to the center of gravity of the slot 20a. The normal direction is represented as a z direction in the drawings such as FIG. 1. Moreover, the state of "crossing over above the slot" corresponds to a case where the first conductive wire 41 is so disposed that it is spaced away from the slot 20a while intersecting with the slot 20a in a plan view in the z direction. The first conductive wire 41 of this embodiment crosses over the slot 20a, with a space left between them. In the case of disposing the first conductive wire 41 so as to cross over the slot 20a in that way, the first conductive wire 41 and the slot 20a can be coupled to each other by a magnetic field produced between them.

Moreover, the first conductive wire 41 of this embodiment has its tip end kept in contact with the conductor plate 21. The tip end can thus be regarded as a short-circuited end. In the case where the tip end can be regarded as a short-circuited end, the length of the first conductive wire 41 should preferably be adjusted to about an integral multiple of a length equal to one-half the signal wavelength. The length adjustment for the first conductive wire 41 becomes possible by forming the first conductive wire 41 using a bonding wire.

Moreover, the first conductive wire 41, in a plan view in the z direction, intersects with the slot 20a at the midportion of the slot 20a in the first direction (x direction). The first conductive wire 41 of this embodiment, in a plane view in the z direction, intersects with the first direction (x direction) in which the through hole 21a of the conductor plate 21 is elongated.

By extending the first conductive wire 41 in the above manner, even if the first conductive wire 41 is mounted with positional deviation in the course of manufacture, it is possible to achieve its coupling with the slot 20a.

The first conductive wire 41 of this embodiment extends so as to be perpendicular to the first direction. Even if the first conductive wire 41 extends at an inclined angle with respect to the direction perpendicular to the first direction of the slot 20a, it is possible to achieve electromagnetic coupling. By disposing the first conductive wire 41 in such a manner that the extending direction of the first conductive wire 41 and the first direction form as true a right angle as possible, an electric-field component parallel to the second direction aligned with the relatively short side of the slot 20a can be increased. The increase of the component parallel to the direction aligned with the relatively short side of the slot 20a helps strengthen the electromagnetic coupling between the first conductive wire 41 and the slot 20a.

The second conductive wires 42 and 43 provide electrical connection between the conductor plate 21 and the reference potential terminal 32. The second conductive wires 42 and 43 of this embodiment provide direct connection between the conductor plate 21 and the reference potential terminal 32. The second conductive wires 42 and 43 are connected at first ends to the reference potential terminal 32, respectively. The second conductive wires 42 and 43 are connected at second ends 42a and 43a to the conductor plate 21, respectively. The second ends 42a and 43a of the second conductive wires 42 and 43 are situated ahead of the slot 20a when viewed from the high-frequency component 30. That is, the second conductive wires 42 and 43 do not cross over above the slot 20a.

Moreover, as shown in FIG. 3, the second ends 42a and 43a of the second conductive wire 42 and 43 are so disposed that, when the slot 20a is viewed in a plane view, line segments $H_{12}$ and $H_{13}$ connecting the second end 42a and 43a with the second end 41a of the first conductive wire 41 cross over the slot 20a. In the region around the first conductive wire 41, a magnetic field is produced thereby establishing coupling with the slot 20a.

Moreover, the second conductive wires 42 and 43 are disposed along the first conductive wire 41 in a plan view. By bringing the two second conductive wires 42 and 43 into line with the first conductive wire 41 in this way, it is possible to strengthen the electromagnetic coupling with the first conductive wire 41. By strengthening the electromagnetic coupling between the first conductive wire 41 and the second conductive wires 42 and 43, a transmission line composed of the first conductive wire 41 and each of the second conductive wires 42 and 43 is formed. The formation of the transmission line composed of the first conductive wire 41 and each of the second conductive wires 42 and 43 makes it possible to suppress an inductance component ascribable to the length of the first conductive wire 41. Moreover, the formation of the signal line makes it possible to reduce leakage of a high-frequency signal in electromagnetic-wave form from the first conductive wire 41. In this embodiment, since the signal terminal 31 is situated between the two reference potential terminals 32, it is possible to achieve a further increase in strength of the electromagnetic coupling between the first conductive wire 41 connected to the signal terminal and the second conductive wires 42 and 43.

Moreover, the first conductive wire 41 and the second conductive wires 42 and 43 are electrically connected to the slot 20a having a capacitance component. Accordingly, the inductance component of the first conductive wire 41 can be canceled out by the capacitance component of the slot 20a. The capacitance component of the slot 20a can be controlled simply by making adjustment to the length of the slot in the second direction. Thus, in the high-frequency module 10, the slot can matches to the impedance in the second end 41a of the first conductive wire 41, as well as the second ends 42a and 43a of the second conductive wires 42 and 43. In contrast to a stub designed for impedance matching only at specific wavelengths, the high-frequency module 10 is capable of matching over a wide range of frequencies. Note that the impedance of the slot 20a can be controlled by adjusting its length in the first direction.

The second conductive wires 42 and 43 of this embodiment extend in parallel with the first conductive wire 41 when viewed in the z direction. Note that, the second conductive wires 42 and 43 do not necessarily have to be so disposed as to extend in parallel with the first conductive wire 41. A distance between the second conductive wires 42 and 43 may increase or decrease as the second conductive wires 42 and 43 approach the slot 20a. In the case where the distance between the second conductive wires 42 and 43 decreases, among electric-field components coupled to the first conductive wire 41, the electric-field component of the slot 20a parallel to the relatively short side of the slot 20a is increased, with a consequent increase of a magnetic-field component which is coupled to the slot 20a. The second ends 42a and 43a of the second conductive wires 42 and 43 of this embodiment are placed on the conductor plate 21 so as to be located inward area with respect to the end of the through hole 21a of the conductor plate 21 in the first direction of the slot 20a.

The first conductive wire 41 and the second conductive wires 42 and 43 of this embodiment act to connect the signal terminal 31 and the adjacent reference potential terminal 32 with the slot structure 20 having the slot 20a. Pairs of the first conductive wire 41 and the respective second conductive wires 42 and 43 allow gradual changes in the direction of an electric field produced between the first conductive wire 41 and the respective second conductive wires 42 and 43 in the region between the signal terminal 31 as well as the reference potential terminal 32 and the slot 20a. In the first conductive wire 41 and the second conductive wires 42 and 43, the gradual changes of the direction of the electric field produced between them facilitates the coupling with the slot 20a.

The protection member 50 is disposed to straddle over the slot 20a, the high-frequency component 30, and the conductive wire 40. The protection member 50 provides cover at least above the slot 20a, the high-frequency component 30, and the conductive wire 40. The protection member 50 provides protection for at least above the slot 20a, the high-frequency component 30, and the conductive wire 40. The term "protection" refers to mechanical protection. For example, the protection helps lessen the likelihood of a break in the conductive wire 40 caused by an external force. Note that the protection member 50 is imaginarily represented by dotted lines in the drawings for illustration of the slot 20a, the high-frequency component 30, and the conductive wire 40. The protection member 50 is not limited in function to the sealing of the slot 20a, the high-frequency component 30, and the conductive wire 40. For example, although not shown in the drawings, the protection member 50 may be so configured that a part of the lateral surfaces is missing, that a through hole is formed on the upper surface, or that the top is supported on a plurality of support columns. As another alternative of the protection member 50, the slot, the high-frequency component, and the conductive wire may be covered with a resin material. In this case, the shapes of the conductive wire 40 and the slot 20a are adjusted with consideration given to the dielectric constant of the resin material.

The high-frequency module 10 of this embodiment comprises the high-frequency component 30 including a high-frequency circuit, the conductor plate 21 acting as a conductor, the first conductive wire 41, and the two second conductive wires 42 and 43. The high-frequency component 30 has the signal terminal 31 and the two reference potential terminals 32. The signal terminal 31 is used for at least one of input and output of a high-frequency signal. The two reference potential terminals 32 are connected to a reference potential. The conductor plate 21 has the slot 20a. The first conductive wire 41 is electrically connected to the signal terminal 31. The first conductive wire 41 extends while crossing over above the slot 20a. The two second conductive wires 42 and 43 are electrically connected to the two reference potential terminals 32, respectively. The two second conductive wires 42 and 43 are arranged alongside the first conductive wire 41. The two second conductive wires 42 and 43 do not cross over above the slot 20a. The first conductive wire 41 and each of the two second conductive wires 42 and 43 form a transmission line and are electromagnetically coupled to the slot 20a.

In the high-frequency module 10 of this embodiment, in a plan view, the lines $H_{12}$ and $H_{13}$ connecting the slot 20a-side second end 41a of the first conductive wire 41 with the slot 20a-side second ends 42a and 43a of the second conductive wires 42 and 43 cross over the slot 20a. In this structure, an electric field traveling from the first conductive wire 41 toward the second conductive wires 42 and 43 crosses over the slot 20a. With a resultant magnetic field, it is possible to achieve a further increase in strength of the electromagnetic coupling of the first conductive wire 41 and the second conductive wires 42 and 43 with the slot 20a.

In the high-frequency module 10 of this embodiment, an increase in length of the first conductive wire 41 makes it possible to lower a frequency at which the best coupling with the slot 20a can be achieved. On the other hand, a decrease in length of the first conductive wire 41 makes it possible to raise the frequency at which the best coupling with the slot 20a can be achieved. Thus, in the high-frequency module 10 of this embodiment, it is possible to adjust the frequency for the best coupling with the slot 20a, and thereby make allowance for mounting deviation of the high-frequency component 30 and dimensional or positional deviation of the slot 20a in the design of the high-frequency module.

In the high-frequency module 10 of this embodiment, a transmission line is formed of the first conductive wire 41 and each of the second conductive wires 42 and 43, wherefore the conductive wire 40 can be lengthened. Accordingly, in the high-frequency module 10, the high-frequency component 30 can be placed on the slot structure 20. The high-frequency module 10 is therefore suitable for the use of the high-frequency component 30 having a large thickness.

In the high-frequency module 10 of this embodiment, the high-frequency component 30 is placed on the slot structure 20. In the high-frequency module 10, in contrast to the case where a cavity is formed in the slot structure 20, the dimensional accuracy of the slot structure 20 can be increased. Thus, in the high-frequency module 10, an electrical element can be formed in the slot structure 20 in an efficient manner.

In the high-frequency module 10 of this embodiment, the high-frequency circuit of the high-frequency component 30 is electromagnetically coupled to the slot 20a through the conductive wire 40. Therefore, the high-frequency module 10 can achieve lower loss than would be the case where, after connection is established between the high-frequency circuit and a signal line such as a microstrip line while effecting impedance matching, the signal line is electromagnetically coupled to the slot. Moreover, in the high-frequency module 10, the distance traveled by a high-frequency signal can be reduced thereby achieving miniaturization.

In the high-frequency module 10 of this embodiment, since the high-frequency circuit of the high-frequency component 30 and the slot 20a are electromagnetically coupled to each other, it is possible to cut off a direct-current component between a high-frequency signal propagating through the high-frequency circuit of the high-frequency component 30 and a high-frequency signal passing through the slot 20a. Thus, the high-frequency module 10 is suitable for a high-frequency circuit having a diode.

In the high-frequency module 10 of this embodiment, since the high-frequency circuit of the high-frequency component 30 and the slot 20a are electromagnetically coupled to each other, it is possible to provide flexibility in the positions of the second end 41a of the first conductive wire 41 and the second end 42a, 43a of the second conductive wire 42, 43. Accordingly, in the high-frequency module 10, manufacturing process variations such for example as the positional deviation of the high-frequency component 30 having the high-frequency circuit, the positional deviation of the slot 20a, and the dimensional deviation of the slot 20a can be tolerated.

Second Embodiment

Figure 4:
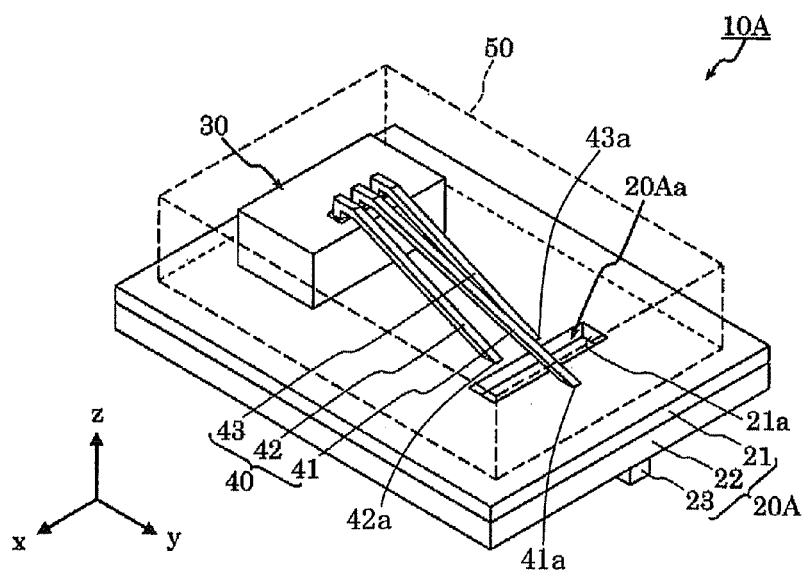
FIG. 4 is an external perspective view schematically showing a second embodiment of the high-frequency module according to the invention.
Figure 5:
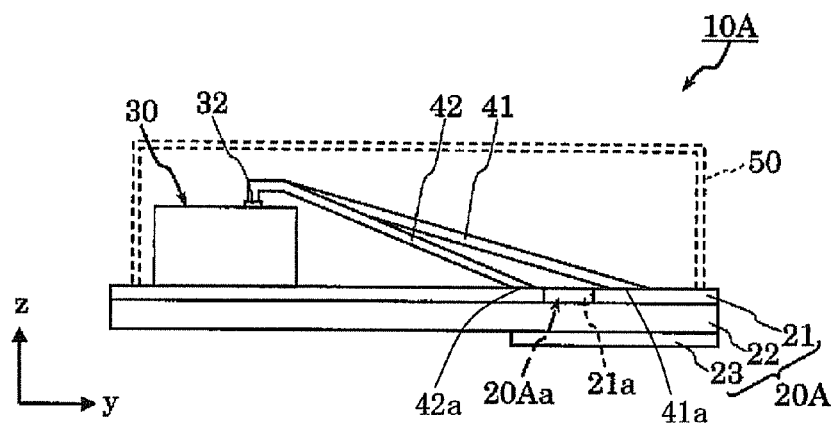
FIG. 5 is a side view schematically showing the high-frequency module shown in FIG. 3.

A high-frequency module 10A in accordance with a second embodiment as shown in FIGS. 4 and 5 differs from the high-frequency module 10 of FIGS. 1-3 in that a slot structure 20A is provided. Note that the following description about this embodiment deals only with the points of difference from the high-frequency module 10 of the first embodiment, and thus such constituent components as are common to the high-frequency module 10A and the high-frequency module 10 will not be explained. In the description pertaining to the specification, capital alphabetic characters denote different embodiments or modified examples.

As shown in FIGS. 4 and 5, the slot structure 20A comprises a conductor plate 21, a dielectric body 22, and a strip conductor 23. The dielectric body 22 is disposed on the lower surface of the conductor plate 21. The strip conductor 23 is disposed on the lower surface of the dielectric body 22. The conductor plate 21, the dielectric body 22, and the strip conductor 23 constitute a microstrip line with the conductor plate 21 defined as reference potential.

The strip conductor 23 is disposed opposite to a slot 20Aa, with the dielectric body 22 lying between them. Moreover, the strip conductor 23 extends so as to intersect with the first direction of the slot 20Aa. Thus, in the dielectric structure 20A, the slot 20Aa and the microstrip line are electromagnetically coupled to each other. As a result, the high-frequency circuit of the high-frequency component 30 is electromagnetically coupled to the microstrip line acting as a signal line through the slot 20Aa. In this embodiment, the impedance of the slot 20Aa matches to the impedance of the second end 41a of the first conductive wire 41 and the second ends 42a and 43a of the second conductive wires 42 and 43.

While this embodiment employs the microstrip line as a signal line, a signal line of another type may be employed. Although not shown in the drawings, the examples thereof include a coplanar line, a strip line (triplate line), a slot line, an image line, an H waveguide, and an NRD waveguide (Non-Radiative Dielectric waveguide).

In the high-frequency module 10A of this embodiment, the high-frequency circuit of the high-frequency component 30 for transmission of a high-frequency signal is electromagnetically coupled to the slot 20Aa via the first conductive wire 41 and each of the second conductive wires 42 and 43 which form a pair. The slot 20Aa is electromagnetically coupled to the microstrip line. A high-frequency signal passing through the slot 20Aa is transmitted to the microstrip line by electromagnetic coupling. In the high-frequency module 10A, the first conductive wire 41 and the strip conductor 23 are purely electrically separated from each other. That is, in the high-frequency module 10, the slot 20Aa serves as intermediary for transmission between two high-frequency circuits, wherefore the inductance component of the first conductive wire 41 is separated from the impedance of the microstrip line.

Third Embodiment

Figure 6:
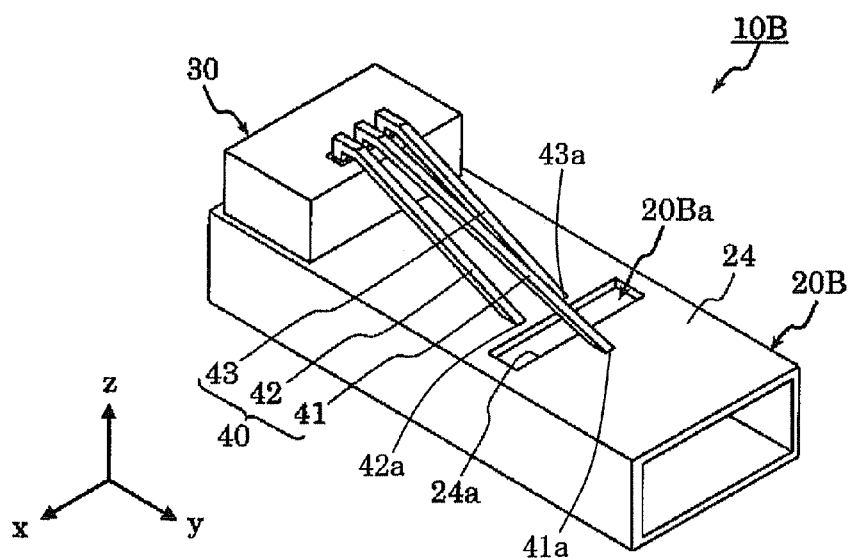
FIG. 6 is an external perspective view schematically showing a third embodiment of the high-frequency module according to the invention.
Figure 7:
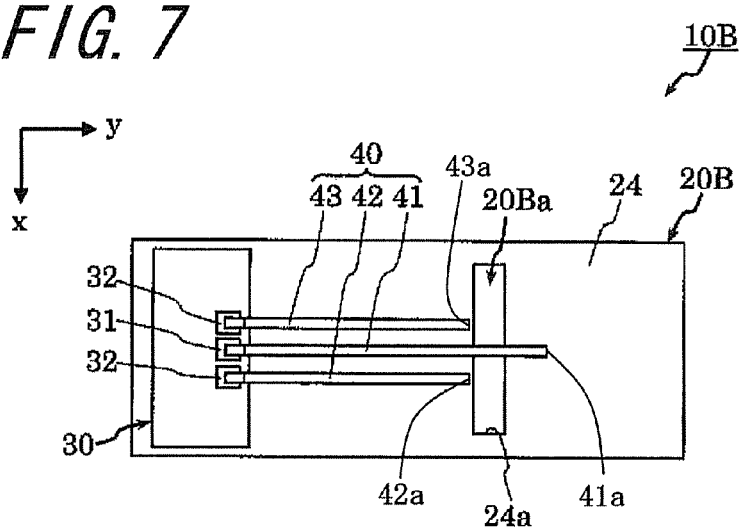
FIG. 7 is a plan view schematically showing the high-frequency module shown in FIG. 5.

A high-frequency module 10B in accordance with a third embodiment as shown in FIGS. 6 and 7 differs from the high-frequency module 10 in that a slot structure 20B is provided. Note that the following description about this embodiment deals only with the points of difference from the high-frequency module 10 of the first embodiment of FIGS. 1-3., and thus such constituent components as are common to the high-frequency module 10B and the high-frequency module 10 will not be explained.

In this embodiment, as shown in FIGS. 6 and 7, a waveguide 24 is employed as the slot structure 20B. In the slot structure 20B, a through hole 24a is formed at the upper waveguide wall of the waveguide 24. In this embodiment, the through hole 24a of the waveguide 24 functions as a slot 20Ba. A high-frequency signal propagates through the slot 20Ba to the waveguide 24. In this way, the high-frequency circuit and the waveguide 24 are electromagnetically coupled to each other via the slot 20Ba. In this embodiment, the impedance of the slot 20Aa matches to the impedance of the second end 41a of the first conductive wire 41 and the second ends 42a and 43a of the second conductive wires 42 and 43. Note that, in the high-frequency module 10B of this embodiment, the upper waveguide wall of the waveguide 24 serves as a conductor having a widened plane surface.

While the waveguide 24 illustrated in this embodiment is formed of waveguide walls with a hollow interior, it may have a dielectric-filled structure. Moreover, the through hole 24a of the waveguide 24 can be formed at any one of an E-plane, an H-plane, and an end face thereof. The coupling becomes possible regardless of which surface bears the through hole 24a so long as the orientation of the slot 20Ba is selected properly.

In the high-frequency module 10B of this embodiment, the high-frequency circuit of the high-frequency component 30 for transmission of a high-frequency signal is electromagnetically coupled to the slot 20Ba via the first conductive wire 41 and each of the second conductive wires 42 and 43 which form a pair. A high-frequency signal passing through the slot 20Ba propagates through the waveguide 24. Thus, the high-frequency module 10B is capable of efficient high-frequency signal transmission.

Fourth Embodiment

Figure 8:
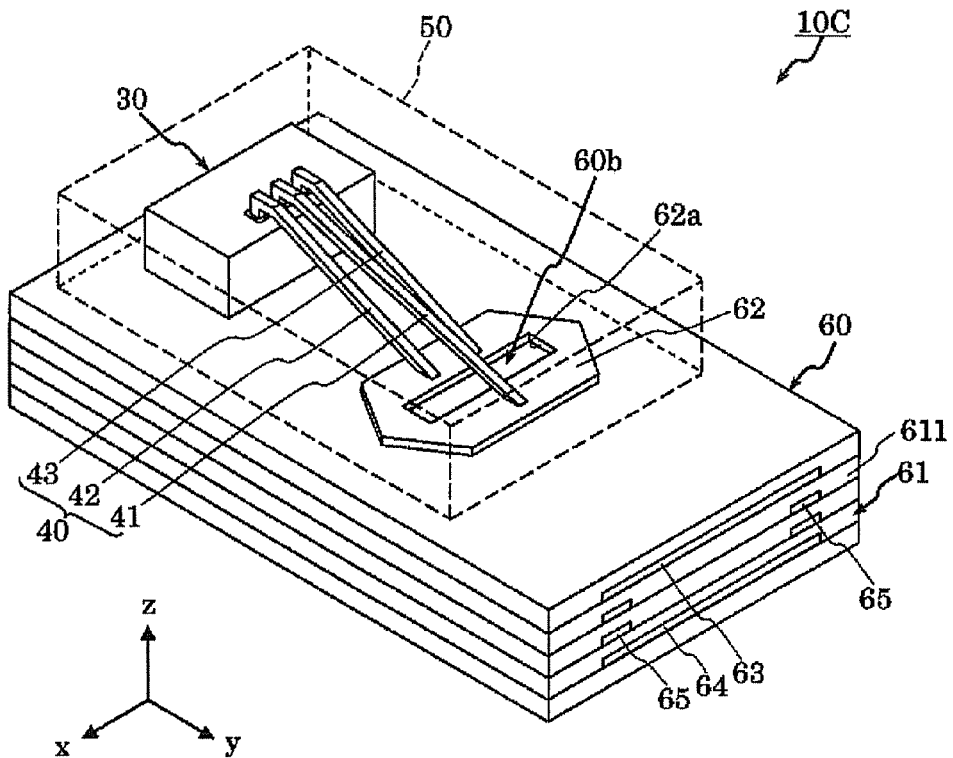
FIG. 8 is an external perspective view schematically showing a fourth embodiment of the high-frequency module according to the invention.
Figure 9:
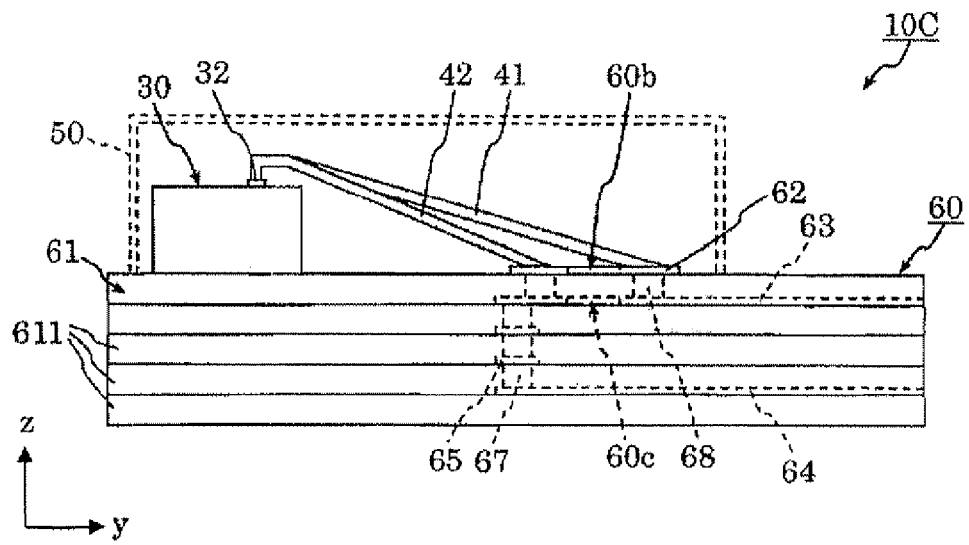
FIG. 9 is a side view schematically showing the high-frequency module shown in FIG. 8.

A high-frequency module 10C in accordance with a fourth embodiment as shown in FIGS. 8 and 9 differs from the high-frequency module 10 of FIGS. 1-3 in that a second slot structure 60 is provided. Note that the following description about this embodiment deals only with the points of difference from the high-frequency module 10 of the first embodiment, and thus such constituent components as are common to the high-frequency module 10C and the high-frequency module 10 will not be explained.

Figure 10:
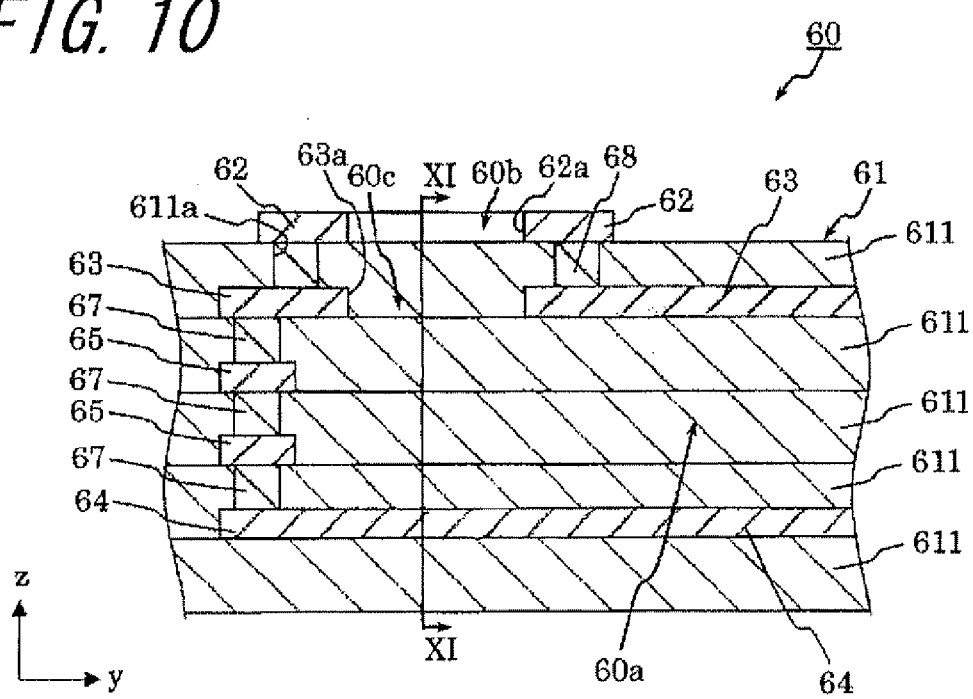
FIG. 10 is an enlarged sectional view showing the main part of the second slot structure shown in FIG. 8.
Figure 11:
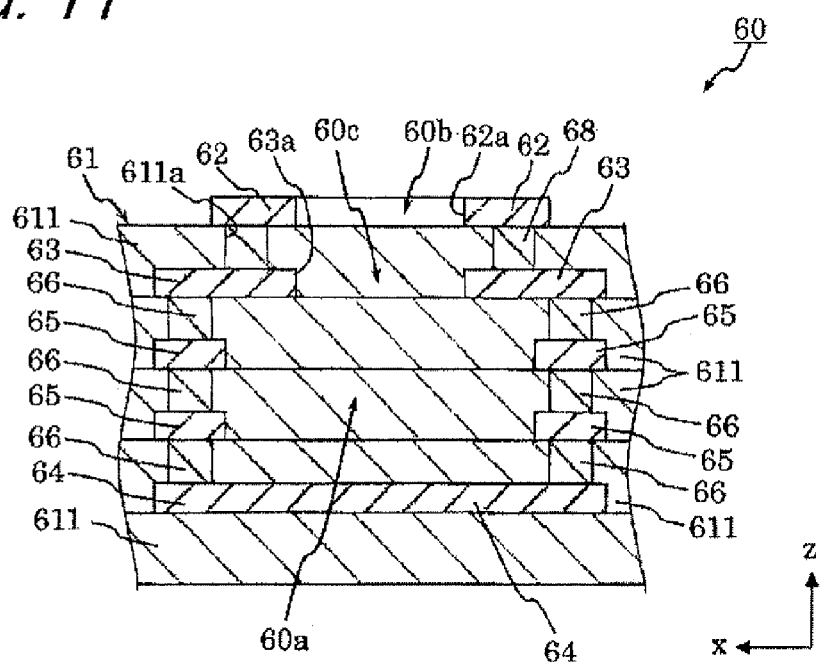
FIG. 11 is a sectional view taken along the line XI-XI shown in FIG. 10.
Figure 12:
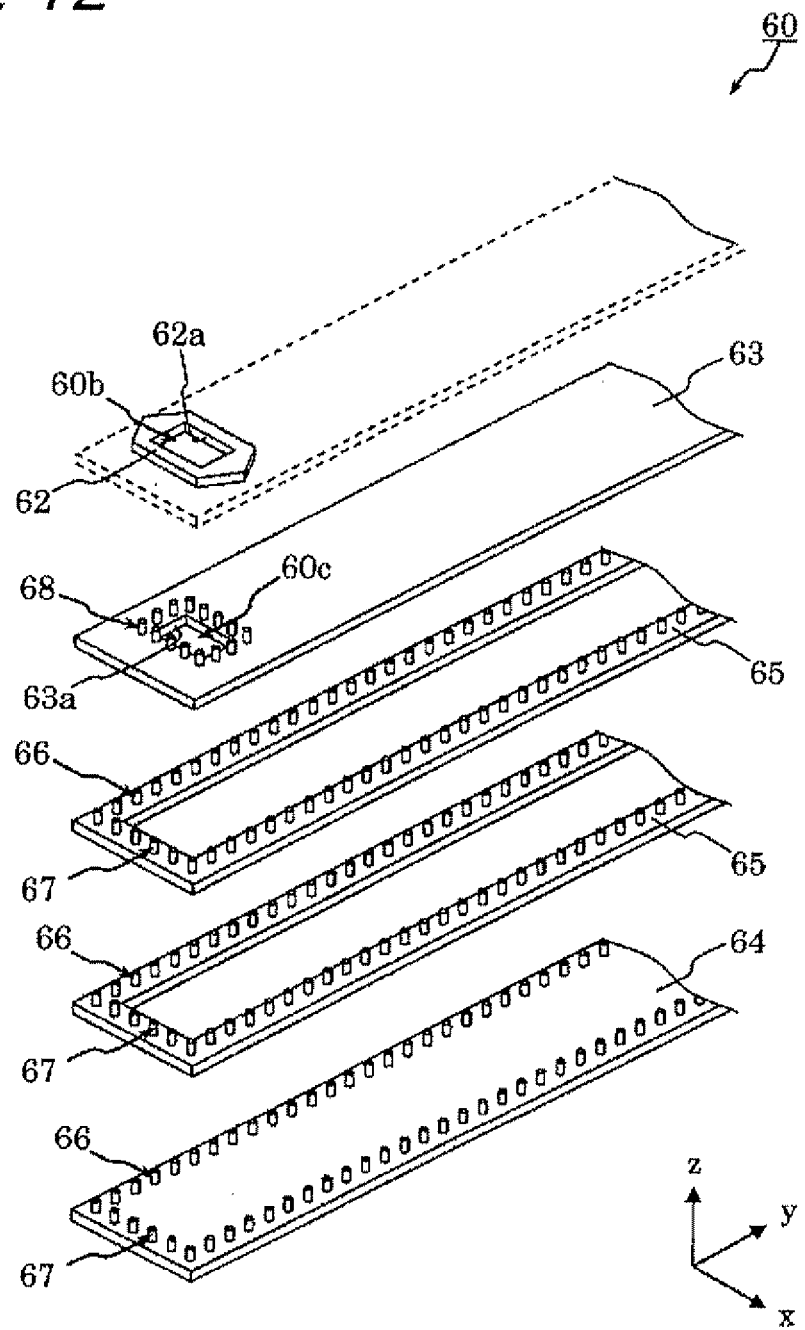
FIG. 12 is an exploded perspective view schematically showing the configuration of the second slot structure shown in FIG. 8.

The second slot structure 60 shown in FIGS. 8 to 12 comprises a laminated body 61 (FIGS. 8-11), a slot conductor 62, an upper conductor layer 63, a lower conductor layer 64, an intermediate conductor layer 65, a first through conductor group 66 (FIGS. 11, 12), a second through conductor group 67 (FIGS. 9, 10, 12), and a third through conductor group 68 (FIGS. 9-12). Among them, the upper conductor layer 63, the lower conductor layer 64, the intermediate conductor layer 65, the first through conductor group 66, and the second through conductor group 67 function as a multilayer waveguide 60a (FIGS. 10, 11).

The laminated body 61 is constructed by laminating a plurality of dielectric layers 611 (FIGS. 10, 11) on top of each other. The laminated body 61 of this embodiment is composed of five laminated dielectric layers 611. Note that the illustration of the laminated body 61 is omitted in FIG. 12.

The slot conductor 62 is formed on the upper surface of the laminated body 61. The slot conductor 62 has a through hole 62a (FIGS. 8, 10-12). The through hole 62a functions as a slot 60b which is electromagnetically coupled to the conductive wire 40 (FIG. 8). The slot 60b corresponds to the slot 20a of FIGS. 1-3.

The upper conductor layer 63 serves as the upper waveguide wall of the multilayer waveguide 60a. In this embodiment, the upper conductor layer 63 is formed on a dielectric layer 611 which is the second layer from the top. The upper conductor layer 63 extends in the propagation direction of a high-frequency signal which propagates through the multilayer waveguide 60a. The upper conductor layer 63 is disposed opposite to the through hole 62a of the slot conductor 62. The upper conductor layer 63 has a through hole 63a (FIGS. 10-12) formed in the area thereof opposed to the through hole 62a. The through hole 63a functions as a slot 60c (FIGS. 9-12) of the multilayer waveguide 60a. That is, the slot 60b and the slot 60c are arranged opposite to each other.

The lower conductor layer 64 serves as the lower waveguide wall of the multilayer waveguide 60a. The lower conductor layer 64 is located below the upper conductor layer 63. The lower conductor layer 64 is disposed opposite to the upper conductor layer 63. In this embodiment, the lower conductor layer 64 is formed on the lowermost dielectric layer 611. The lower conductor layer 64 extends in the propagation direction of a high-frequency signal which propagates through the multilayer waveguide 60a.

The intermediate conductor layer 65 serves as a part of the side wall of the multilayer waveguide 60a. The intermediate conductor layer 65 is located between the dielectric layers 611 lying between the upper conductor layer 63 and the lower conductor layer 64. In this embodiment, two intermediate conductor layers 65 are formed. Note that the intermediate conductor layer 65 may be omitted.

The first through conductor group 66 serves as the side wall of the multilayer waveguide 60a. Each individual through conductor constituting the first through conductor group 66 is formed inside a through hole 611a (FIGS. 10, 11) formed in the dielectric layer 611. The first through conductor group 66 is electrically connected to the upper conductor layer 63 and the lower conductor layer 64. Moreover, the first through conductor group 66 of this embodiment is electrically connected to the intermediate conductor layer 65. The through conductors constituting the first through conductor group 66 are arranged, at a spacing which is less than one-half the wavelength of a high-frequency signal to be propagated, on each of the opposite sides along the propagation direction of the high-frequency signal. The "high-frequency signal to be propagated" refers to a high-frequency signal which propagates through the laminated body 61 formed in the region surrounded by the upper conductor layer 63, the lower conductor layer 64, the intermediate conductor layer 65, and the first through conductor group 66.

In the second slot structure 60 of this embodiment, the upper conductor layer 63, the lower conductor layer 64, the intermediate conductor layer 65, and the first through conductor group 66 serve as the waveguide walls of the multilayer waveguide 60a. In the second slot structure 60, the region surrounded by the upper conductor layer 63, the lower conductor layer 64, and the first through conductor group 66 serves as a waveguide region for the high-frequency signal. Moreover, the multilayer waveguide 60a is disposed opposite to the through hole 62a of the slot conductor 62.

The second through conductor group 67 serves as a terminating conductor wall for terminating one side of the multilayer waveguide 60a. Each individual through conductor constituting the first through conductor group 66 is formed inside the through hole 611a formed in the dielectric layer 611. The first through conductor group 66 is electrically connected to the upper conductor layer 63 and the lower conductor layer 64. Moreover, the first through conductor group 66 of this embodiment is electrically connected to the intermediate conductor layer 65. The through conductors constituting the second through conductor group 67 are arranged, at a spacing which is less than one-half the wavelength of the high-frequency signal to be propagated, along a direction perpendicular to the propagation direction of the high-frequency signal.

The third through conductor group 68 has the function of coupling the slot 60b to the slot 60c. The through conductors constituting the third through conductor group 68 are arranged around the through hole 62a of the slot conductor 62. Also, the through conductors constituting the third through conductor group 68 are arranged around the through hole 63a of the upper conductor layer 63. The third through conductor group 68 provides electrical connection between the slot conductor 62 and the upper conductor layer 64. In this way, since the slot conductor 62 and the upper conductor layer 64 are electrically connected to each other, it follows that the second slot structure 60 is capable of propagation of the high-frequency signal between the slot conductor 62 and the upper conductor layer 64.

Fifth Embodiment

Figure 13:
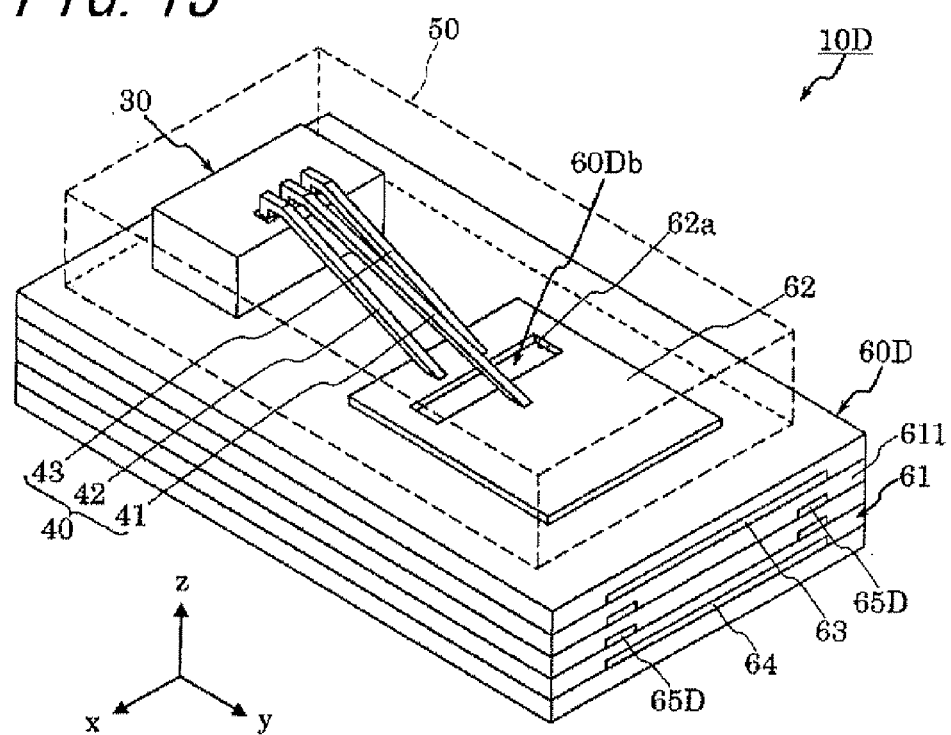
FIG. 13 is an external perspective view schematically showing a fifth embodiment of the high-frequency module according to the invention.
Figure 14:
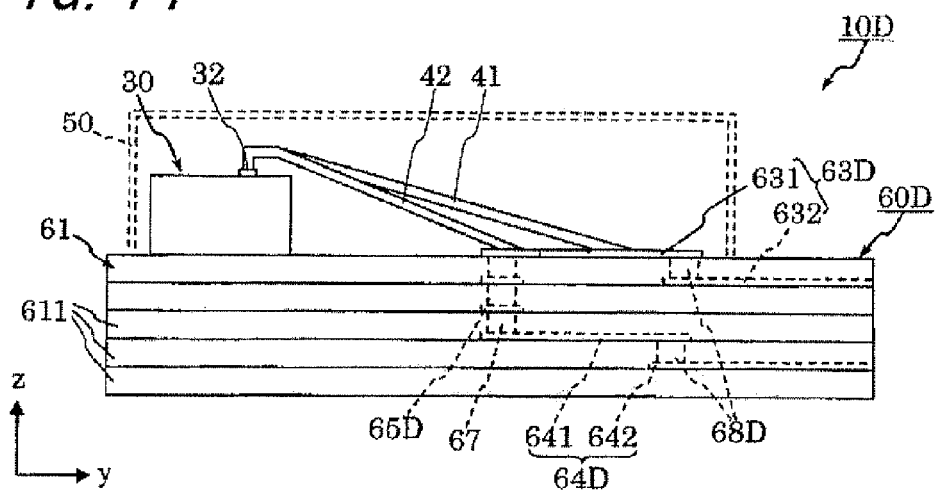
FIG. 14 is a side view schematically showing the high-frequency module shown in FIG. 13.

A high-frequency module 10D in accordance with a fifth embodiment as shown in FIGS. 13 and 14 differs from the high-frequency module 10C of FIGS. 8-12 in that a second slot structure 60D is provided. Note that the following description about this embodiment deals only with the points of difference from the high-frequency module 10C of the first embodiment, and thus such constituent components as are common to the high-frequency module 10D and the high-frequency module 10C will not be explained.

Figure 15:
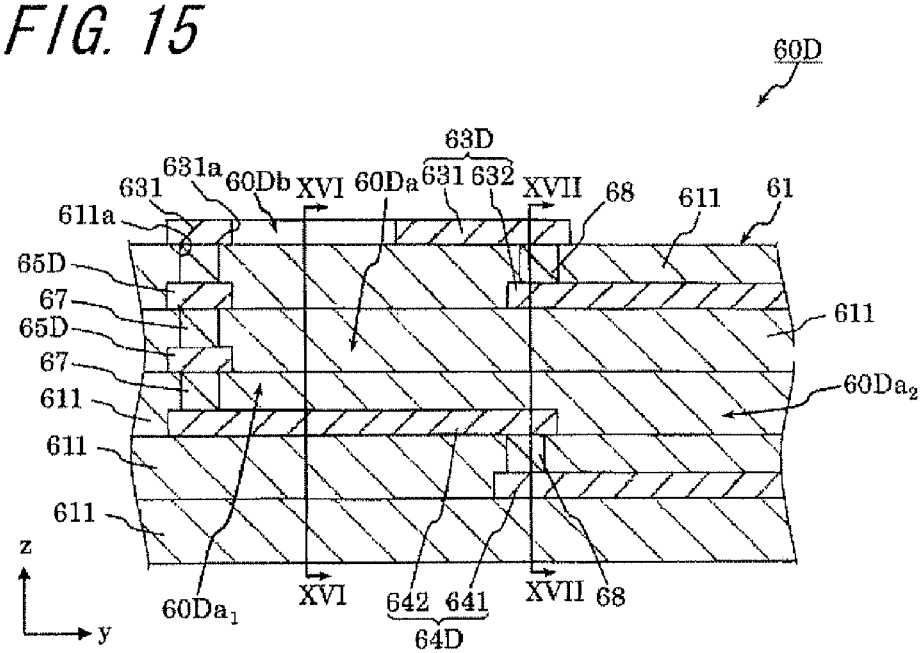
FIG. 15 is an enlarged sectional view showing the main part of another form of the second slot structure shown in FIG. 14.
Figure 16:
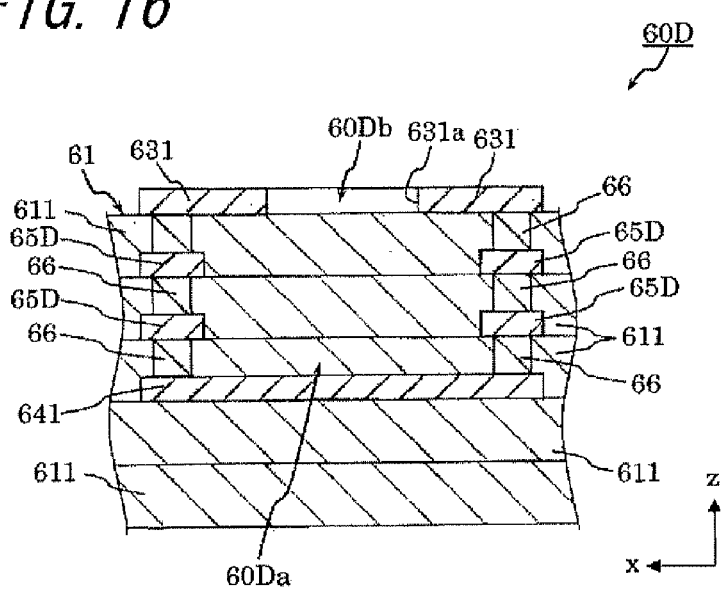
FIG. 16 is a sectional view taken along the line XVI-XVI shown in FIG. 15.
Figure 17:
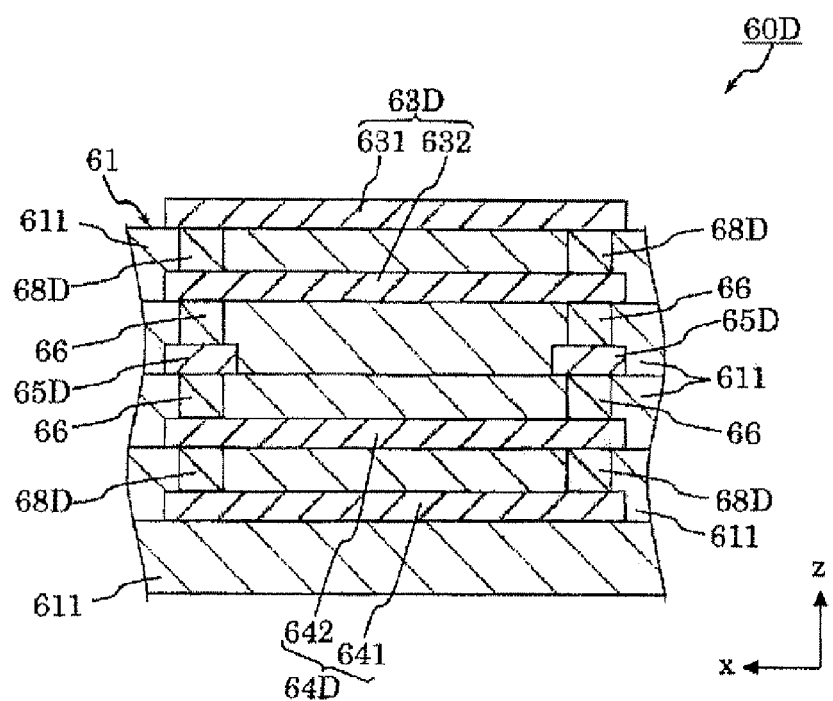
FIG. 17 is a sectional view taken along the line XVII-XVII shown in FIG. 15.
Figure 18:
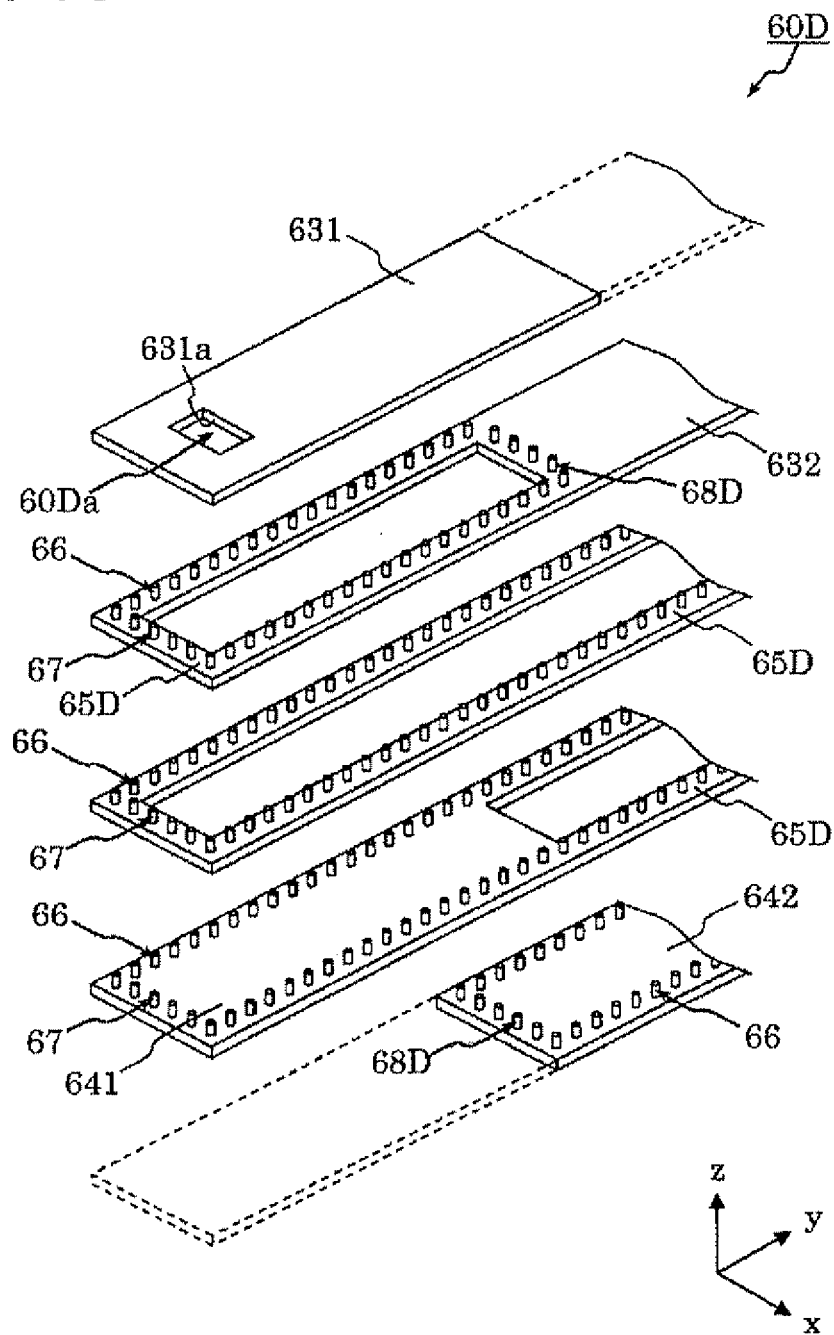
FIG. 18 is an exploded perspective view schematically showing the configuration of the second slot structure shown in FIG. 13.

The second slot structure 60D shown in FIGS. 13 to 18 comprises a laminated body 61 (FIGS. 13-17), an upper conductor layer 63D (FIGS. 14, 15, 17), a lower conductor layer 64D (FIGS. 14, 15, 17), an intermediate conductor layer 65D, a first through conductor group 66 (FIGS. 16-18), a second through conductor group 67 (FIGS. 14, 15, 18), and a third through conductor group 68D (FIGS. 14, 17, 18). Among them, the upper conductor layer 63D, the lower conductor layer 64D, the intermediate conductor layer 65D, the first through conductor group 66, the second through conductor group 67, and the third through conductor group 68D function as a multilayer waveguide 60Da (FIGS. 15, 18). Note that the illustration of the laminated body 61 is omitted in FIG. 18.

The upper conductor layer 63D serves as the upper waveguide wall of the multilayer waveguide 60Da. The upper conductor layer 63D of this embodiment includes a first upper conductor layer 631 (FIGS. 14-18) and a second upper conductor layer 632 (FIGS. 14, 15, 17, 18).

The first upper conductor layer 631 is formed on the upper surface of the laminated body 61. The first upper conductor layer 631 is so formed as to extend in the propagation direction of a high-frequency signal which propagates through the multilayer waveguide 60Da. The first upper conductor layer 631 has a through hole 631a (FIGS. 15, 16, 18). The through hole 631a functions as a slot 60Db (FIGS. 13, 15, 16) which is electromagnetically coupled to the conductive wire 40. The through hole 631a functions as the slot 60Db of the multilayer waveguide 60Da. The slot 60Db corresponds to the slot 20a of FIGS. 1-3.

The second upper conductor layer 632 is located below the first upper conductor layer 631. The second upper conductor layer 632 is disposed, with a part thereof opposed to the first upper conductor layer 631. In this embodiment, the second upper conductor layer 632 is formed on a dielectric layer 611 (FIGS. 13-17) which is the second layer from the top. The second upper conductor layer 632 extends in the propagation direction of a high-frequency signal which propagates through the multilayer waveguide 60Da.

The lower conductor layer 64D serves as the lower waveguide wall of the multilayer waveguide 60Da. The lower conductor layer 64D is located below the upper conductor layer 63D. The lower conductor layer 64D of this embodiment includes a first lower conductor layer 641 (FIGS. 14-18) and a second lower conductor layer 642 (FIGS. 14, 15, 17, 18).

The first lower conductor layer 641 is disposed opposite to the first upper conductor layer 631. The first lower conductor layer 641 is disposed, with a part thereof opposed to the second upper conductor layer 632. In this embodiment, the first lower conductor layer 642 is formed on a dielectric layer 611 which is the second layer from the bottom. The first lower conductor layer 641 extends in the propagation direction of a high-frequency signal which propagates through the multilayer waveguide 60Da.

The second lower conductor layer 642 is located below the first lower conductor layer 641. The second lower conductor layer 642 is disposed, with a part thereof opposed to the first lower conductor layer 641. The second lower conductor layer 642 is disposed opposite to the second upper conductor layer 632. In this embodiment, the second lower conductor layer 642 is formed on the lowermost dielectric layer 611. The second lower conductor layer 642 extends in the propagation direction of a high-frequency signal which propagates through the multilayer waveguide 60Da.

The intermediate conductor layer 65D serves as a part of the side wall of the multilayer waveguide 60Da. The intermediate conductor layer 65D is formed between the dielectric layers 611 lying between the upper conductor layer 63D and the lower conductor layer 64D. In this embodiment, two intermediate conductor layers 65D are formed in each of the region between the first upper conductor layer 631 and the first lower conductor layer 641 and the region between the second upper conductor layer 632 and the second lower conductor layer 642. A part of the intermediate conductor layer 65D of this embodiment is formed integrally with the second upper conductor layer 632 or the first lower conductor layer 641. Note that the intermediate conductor layer 65D may be omitted.

In the multilayer waveguide 60Da of this embodiment, a first waveguide 60Da$_1$ (FIG. 15) and a second waveguide 60Da$_2$ (FIG. 15) are connected to each other. The first waveguide 60Da$_1$ has the first upper conductor layer 631, the first lower conductor layer 641, the intermediate conductor layer 65D, and the first through conductor group 66 which serve as waveguide walls. In the first waveguide 60Da$_1$, the region surrounded by these waveguide walls serves as a waveguide region for high-frequency signals. The second waveguide 60Da$_2$ has the second upper conductor layer 632, the second lower conductor layer 642, the intermediate conductor layer 65D, and the first through conductor group 66 which serve as waveguide walls. In the second waveguide 60Da$_2$, the region surrounded by these waveguide walls serves as a waveguide region for high-frequency signals.

The third through conductor group 68D provides electrical connection between the first upper conductor layer 631 and the second upper conductor layer 632, as well as between the first lower conductor layer 641 and the second lower conductor layer 642. The third through conductor group 68D is formed in each of the region between the opposed areas of the first upper conductor layer 631 and the second upper conductor layer 632 and the region between the opposed areas of the first lower conductor layer 641 and the second lower conductor layer 642. Moreover, the third through conductor group 68D has the function of connecting the first waveguide 60Da$_1$ with the second waveguide 60Da$_2$.

Modified Example

It should be understood that the application of the invention is not limited to the embodiments described heretofore, and that various changes and modifications may be made therein without departing from the gist of the invention. Although the following description deals basically with modified examples of the first embodiment, where applicable, the second to fifth embodiments are susceptible to modifications. Moreover, modified examples may be used in combination.

In this embodiment, the high-frequency module is illustrated with a limitation in form, but in reality there is no particular limitation to the forms of the high-frequency module. The forms of the high-frequency module include a module of the type that effects communication and transmission by utilizing high-frequency signals. As used herein, the term "communication" is construed as encompassing at least one of functions including signal transmission, signal reception, and transmitting and receiving of signals. As a matter of course high-frequency modules for effecting communication utilizing high-frequency signals include an antenna.

While, in this embodiment, the first conductive wire 41 and the second conductive wires 42 and 43 are configured to make contact with the slot structure 20, the configuration is not so limited. For example, although not shown in the drawings the slot 20a and the first conductive wire 41 may be arranged close to each other without contact for mutual electrical connection. At this time, when the front end of the first conductive wire 41 is kept out of contact with the slot structure 20 or when the front end of the first conductive wire 41 and the slot structure 20 are spaced apart by a barely enough distance for recognition of lack of contact, then the front end can be regarded as an open end. It is thus preferable that the length of the first conductive wire 41 is adjusted to about $(2n-1)/4$ of the signal wavelength. The value represented by "n" takes on a natural number. Moreover, in the case of disposing the other end 41a of the first conductive wire 41 in suspension in midair, for example, after connecting the first end of the first conductive wire 41 to the signal terminal 31, adjustment is made to the condition of location for connection of the second end 41a of the first conductive wire 41, as well as to the setting as to a wire bonding apparatus. In this way, the other end 41a of the first conductive wire 41 can be maintained in an out-of-contact state. At this time, the other end 41a of the first conductive wire 41 can be suspended in midair under the resilience of the first conductive wire 41. Moreover, by securing the first conductive wire 41 and nearby areas with resin, the first conductive wire 41 can be kept in shape with stability.

While, in this embodiment, the first conductive wire 41 is disposed to straddle over the slot 20a for connection with a midportion of the slot 20, the first conductive wire 41 may be disposed for connection with a part of the slot 20 other than at the midportion.

While, in this embodiment, two second conductive wires 42 and 43 are provided, any number of the second conductive wires may be used such as one, or three or more.

Figure 19:
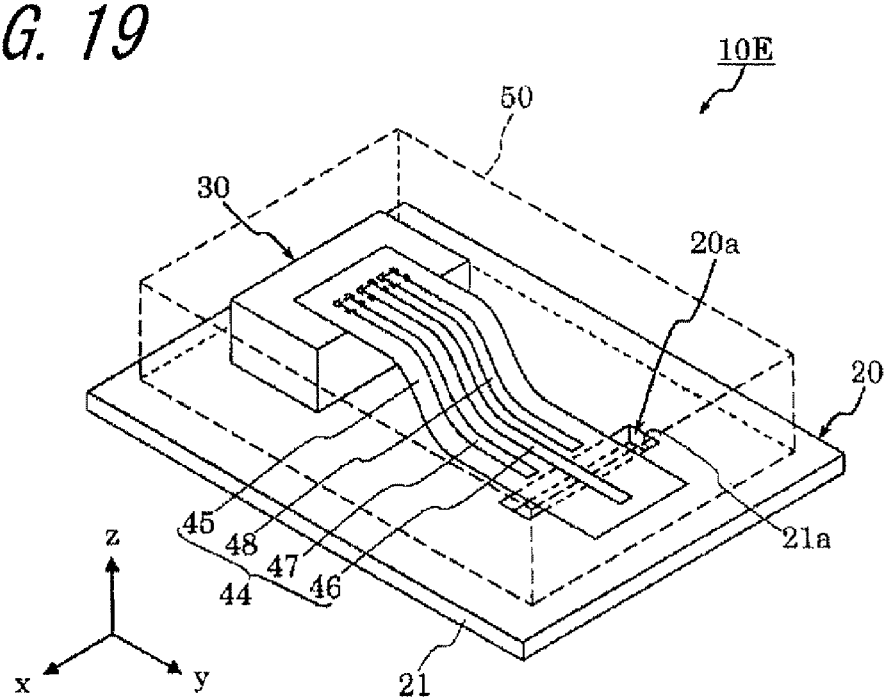
FIG. 19 is an external perspective view schematically showing a modified example of the high-frequency module according to the invention.

While, in this embodiment, the conductive wire 40 is configured in the form of separate conductor components, the configuration is not so limited. For example, a flexible wiring board 45 such as shown in FIG. 19 may be employed as the conductive wire 40. The flexible wiring board 44 is constructed by forming a first conductive wire 46 and second conductive wires 47 and 48 on a base body 45 having flexibility.

Figure 20:
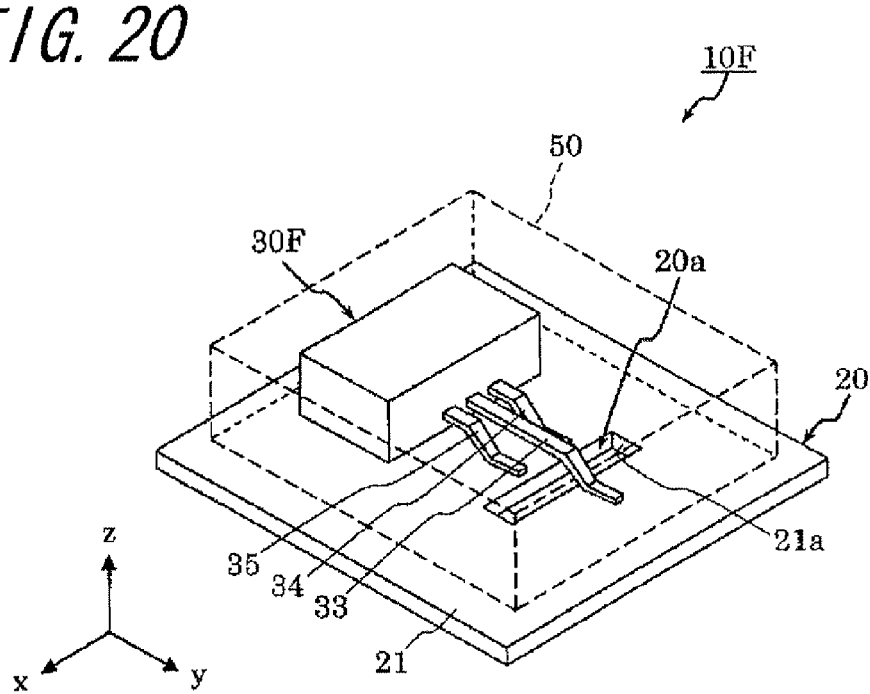
FIG. 20 is an external perspective view schematically showing a modified example of the high-frequency module according to the invention.

While, in this embodiment, the conductive wire 40 is configured in the form of separate conductor components, the configuration is not so limited. For example, a high-frequency component 30F having integral conductive wires such as shown in FIG. 20 may be employed. In the high-frequency component 30F, a signal conductor is formed integrally with a first conductive wire 33, and a reference signal terminal is formed integrally with second conductive wires 34 and 35.

It is preferable that the second end 41a of the first conductive wire 41 of this embodiment extends along the y direction. By configuring the first conductive wire 41 in such a manner that the second end 41a extends along the y direction, it is possible to cause a gradual change of the direction of polarization of an electromagnetic wave which is coupled to the slot 20a in the region between the signal terminal 31 and the slot 20a. The formation of the first conductive wire 41 having the second end 41a extending along the z direction can be achieved under the condition that, for example, a bonding wire is used as the first conductive wire 41 and the first bonding of the bonding wire is conducted at the side of the slot 20a.

The first conductive wire 41 and the second conductive wires 42 and 43 of this embodiment may be covered with a resin material or the like. In the case of covering the conductive wire 40 with a resin material, the first conductive wire 41 and the second conductive wires 42 and 43 may be covered either in a unified manner or on an individual basis. Moreover, in the case of covering the conductive wire 40 with a resin material, the conductive wire 40 and the slot 20a may be covered in a unified manner. In the high-frequency module 10, even if there is variation in impedance depending on the dielectric constant of the resin material, impedance adjustment can be achieved by changing the length of the slot 20a in the second direction.

Figure 21:
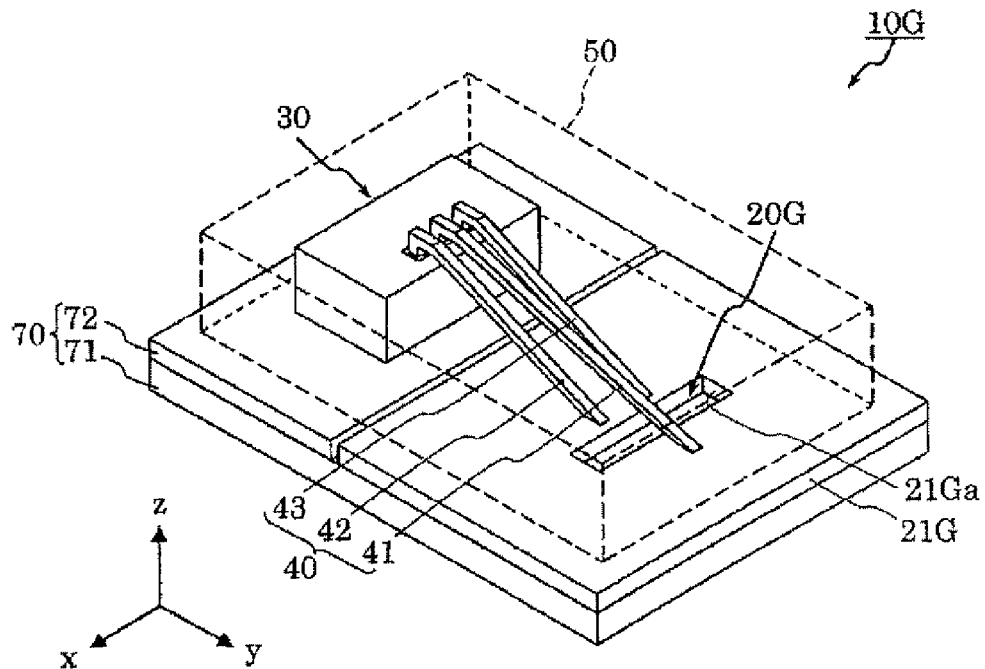
FIG. 21 is an external perspective view schematically showing a modified example of the high-frequency module according to the invention.
Figure 22:
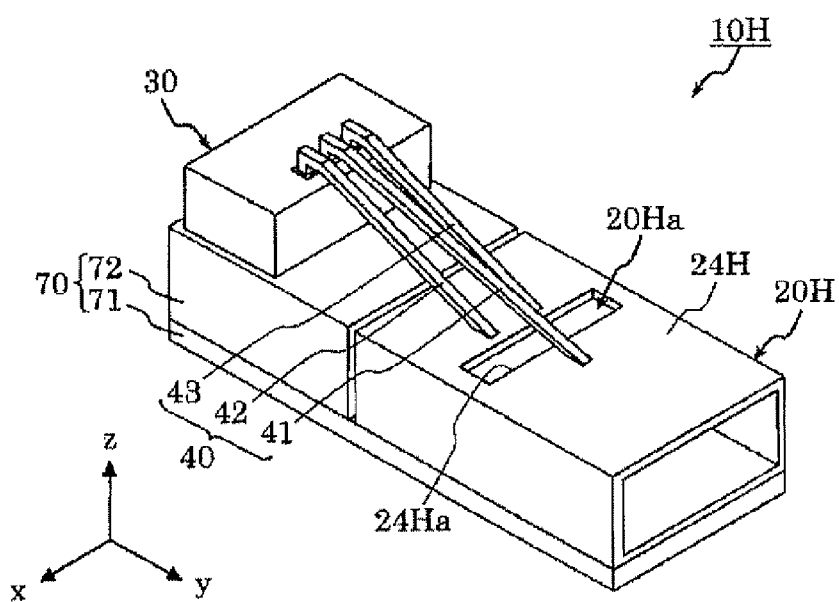
FIG. 22 is an external perspective view schematically showing a modified example of the high-frequency module according to the invention.

While, in this embodiment, the high-frequency component 30 having the built-in high-frequency circuit is disposed on the slot structure 20 by way of example, the high-frequency component 30 may be placed on another mounting board instead of being placed on the slot structure 20. In this case, as shown in FIGS. 21 and 22, a construction employing a mounting board 70 may be cited by way of example. The mounting board 70 illustrated is constructed of two substrates composed of a first substrate 71 and a second substrate 72. The second substrate 72 may be omitted, or may be formed integrally with the first substrate.

Figure 23:
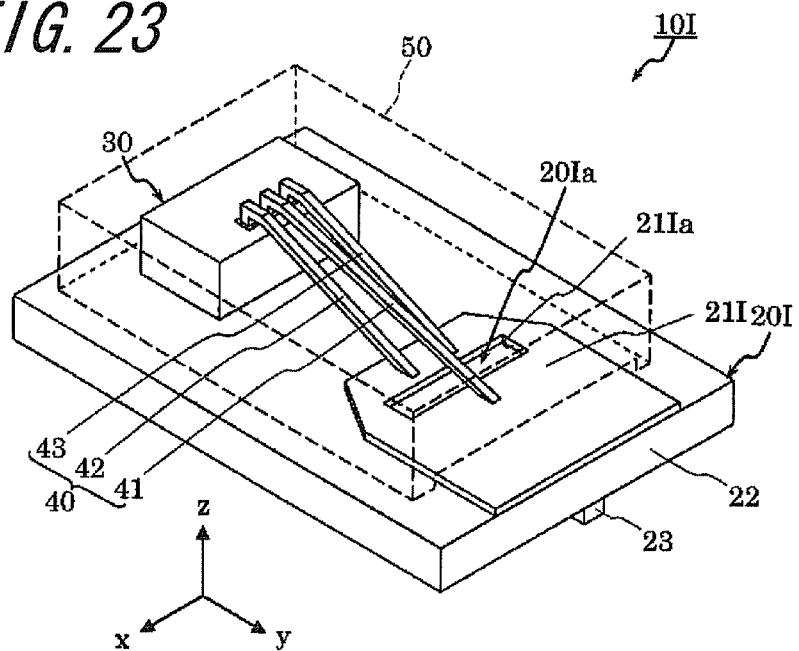
FIG. 23 is an external perspective view schematically showing a modified example of the high-frequency module according to the invention.

Moreover, in the second embodiment, the conductor plate 21 is so disposed as to extend over the entire upper surface of the dielectric body 22. However, as shown in FIG. 23, in a case where the dielectric body 22 is larger than a conductor plate 211, the high-frequency component 30 may be placed on an area where the conductor plate 21 is not placed.

The conductor having a widened plane surface, which has been described as the conductor plate 21 in this embodiment, may be of a conductive material. For example, the conductor may be of a metal plate, an electrically conductive resin, or a film-like conductor formed on a dielectric body. In the case of employing a film-like conductor formed on a dielectric body as the conductor having a widened plane surface, it is possible to reduce the length of the slot 20a depending on the dielectric constant of the dielectric body.

Besides the forms shown in this embodiment, it is also possible for the slot 20a to be coupled to another high-frequency line. Moreover, for example, it is not necessary that the slot should be formed on the surface to which is connected the first conductive wire 41. Alternatively, for example, a dielectric body is disposed on the conductor plate 21, and a through conductor is formed in the dielectric layer for connection with the conductive wire 41. Further, in a case where the dielectric body has a small thickness, even if the conductive wire 41 is kept out of contact with the conductor plate 21, electromagnetic coupling with the slot can be achieved.

Figure 24:
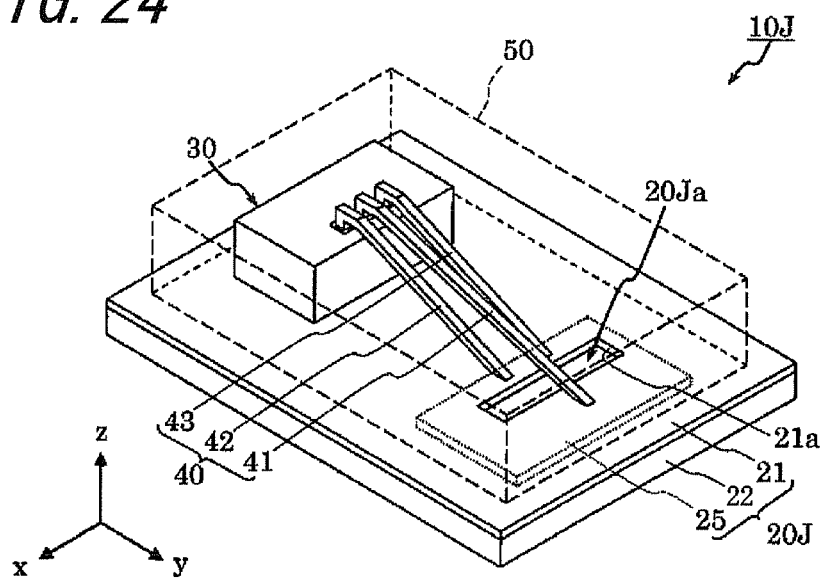
FIG. 24 is an external perspective view schematically showing a modified example of the high-frequency module according to the invention.
Figure 25:
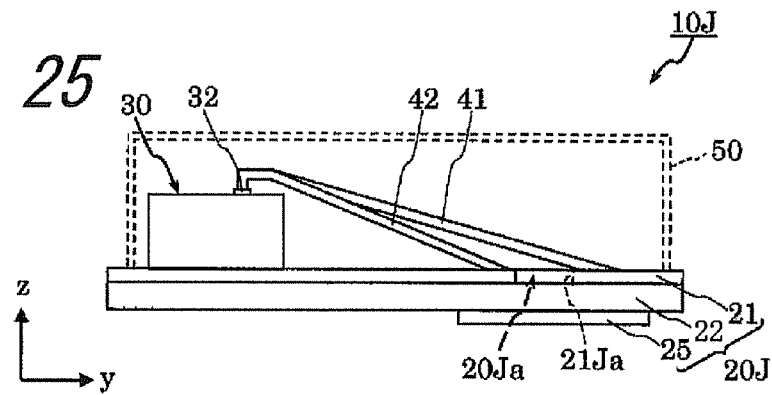
FIG. 25 is a plan view schematically showing a modified example of the high-frequency module shown in FIG. 24.

While, in the second embodiment, the strip line 24 is disposed opposite to the slot 20Aa, with the dielectric body 22 lying between them, the configuration is not so limited. For example, as shown in FIGS. 24 and 25, a patch electrode 25 may be disposed opposite to a slot 20Ja. By disposing the patch electrode 25 opposite to the slot 20Ja, with the dielectric body 22 lying between them, it is possible to construct an antenna. The patch electrode 25 can be formed of various electrically conductive materials.

While, in the second embodiment, the high-frequency circuit and the microstrip line are connected to each other via a single slot 20Aa, the configuration is not so limited. For example, a slot formed by connecting two slots via a through conductor group, like the slot 60b and the slot 60c, may be employed instead of the slot 20Aa. When two high-frequency circuits are connected together via a plurality of slots, impedance matching can be achieved between the high-frequency circuits.

EXAMPLES

Example 1

The electrical characteristics of the high-frequency module 10 according to the first embodiment shown in FIGS. 1, 2, and 3 under a condition where the slot serves as an antenna have been determined by calculation through a simulation based on electromagnetic field analysis. In Example 1, an electromagnetic-field numerical analysis software named HFSS (manufactured by Ansoft corporation in U.S.) was used to run the simulation. Note that Examples 2 and 3, and Comparative Examples 1 and 2 have also been subjected to a simulation in a like manner.

The following numerical values were adopted as conditions for calculation. The thickness of the high-frequency component 30 was set to 385 [μm]. The spacing between the signal terminal 31 and each of the reference potential terminals 32 was set to 100 [μm]. The distance between the center of the signal terminal 31 and the center of the slot 20a was set to 2.05 [mm]. The dimension of the slot 20a was set to 2.6 [mm]×0.2 [mm]. The cross-sectional dimension of the first conductive wire 41 as well as the second conductive wires 42 and 43 was 25 [μm] in diameter. The height of the first conductive wire 41 as well as the second conductive wires 42 and 43 in the z direction measured from the signal terminal 31 or the reference potential terminal 32 was set to 80 [μm]. The distance from a part of the first conductive wire 41 which is connected with the conductor plate 21 to the center of the slot 20a was set to 0.21 [mm]. The positions of connection of the second conductive wires 42 and 43 with the conductor plate 21 relative to the center of the slot 20a were (43 [μm], −140 [μm]) and (−43 [μm], −140 [μm]) represented in displacement vector form (x, y). The thickness of the conductor plate 21 was set to 100 [μm]. And the impedance of the input port composed of the signal terminal 31 and the reference potential terminal 32 was set to 50[Ω]. Under these conditions, as electrical characteristics, reflection characteristics have been determined by calculation. The parameter $s_{11}$ of the so-called S-Matrix (Scattering Matrix), which is an operational transfer matrix, was adopted for the reflection characteristics. The S-Matrix was adopted for the following reason. That is, the slot 20a is an annular conductor and thus does not serve the purpose of defining potential difference. Accordingly, evaluation as to impedance matching has been conducted by examining reflection characteristics obtained as the result of impedance matching.

Figure 26:
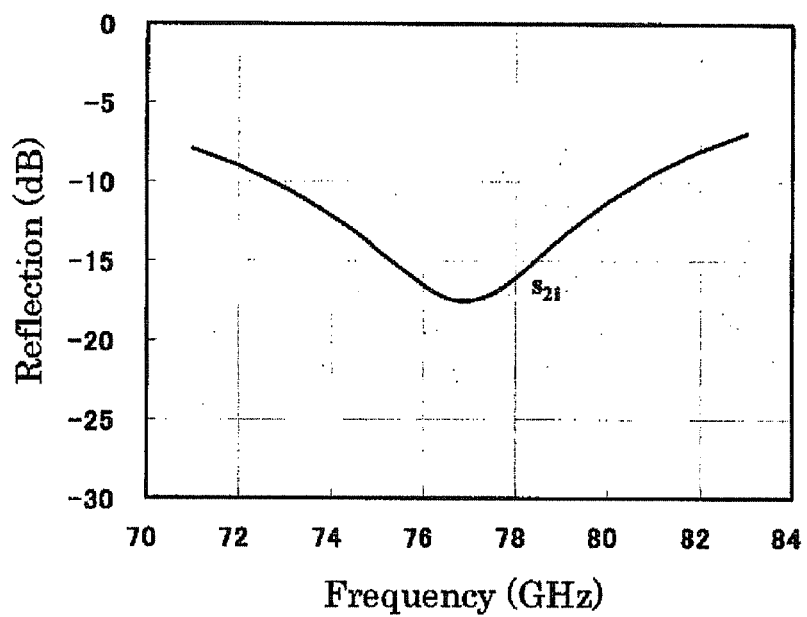
FIG. 26 is a graph of frequency (GHz) vs. the amount of reflection (dB), evidencing the electrical characteristics of the high-frequency module shown in FIGS. 1, 2 and 3.

FIG. 26 is a graph indicating the result of simulation conducted under the above conditions. In the graph, the abscissa axis represents frequencies in GHz and the ordinate axis represents the amounts of reflection in dB. According to the graph shown in FIG. 26, reflection characteristics at the level of −15 [dB] and below are observed at frequencies in the vicinity of 77 [GHz], and a band of frequencies corresponding to reflection amounts of −10 [dB] and below exhibits a broadband characteristic spanning about 8 [GHz]. It will thus be seen that impedance matching can be achieved over a wide frequency range.

Example 2

The electrical characteristics of the high-frequency module 10A according to the second embodiment shown in FIGS. 4 and 5 have been determined by calculation through a simulation based on electromagnetic field analysis.

The following numerical values were adopted as conditions for calculation. The thickness of the high-frequency component 30 was set to 385 [μm]. The spacing between the signal terminal 31 and each of the reference potential terminals 32 was set to 100 [μm]. The distance between the center of the signal terminal 31 and the center of the slot 20Aa was set to 1.62 [mm]. The dimension of the slot 20Aa was set to 1 [mm]×0.16 [mm]. The cross-sectional dimension of the first conductive wire 41 as well as the second conductive wires 42 and 43 was set to 25 [μm] in diameter. The height of the first conductive wire 41 as well as the second conductive wires 42 and 43 in the z direction measured from the signal terminal 31 or the reference potential terminal 32 was set to 80 [μm]. The distance from a part of the first conductive wire 41 which is connected with the conductor plate 21 to the center of the slot 20a was set to 0.58 [mm]. The positions of connection of the second conductive wires 42 and 43 with the conductor plate 21 relative to the center of the slot 20a were (55 [μm], −120 [μm]) and (−55 [μm], −120 [μm]) represented in displacement vector form (x, y). The thickness of the conductor plate 21 was set to 18 [μm]. The specific dielectric constant of the dielectric body 22 constituting the microstrip line was set to 9.87. The thickness of the dielectric body 22 was set to 150 [μm]. The width of the strip conductor 23 was set to 120 [μm]. The length from the center of the slot 20a to the stub of the strip conductor 23 was set to 375 [μm]. And the impedance of the input port composed of the signal terminal 31 and the reference potential terminal 32 was set to 50 [Ω]. With the end face of the microstrip line set at 50 [Ω] in impedance acting as a port, transmission characteristics and reflection characteristics have been determined by calculation. The parameter $s_{11}$ of the S-Matrix was adopted for the transmission characteristics, and reflection characteristics have been determined by calculation. The parameter $s_{21}$ of the S-Matrix was adopted for the transmission characteristics as depicted in FIGS. 26-30, and the parameters $s_{11}$ and $s_{22}$ of the S-Matrix were adopted for the reflection characteristic as depicted in FIGS. 27-30.

Figure 27:
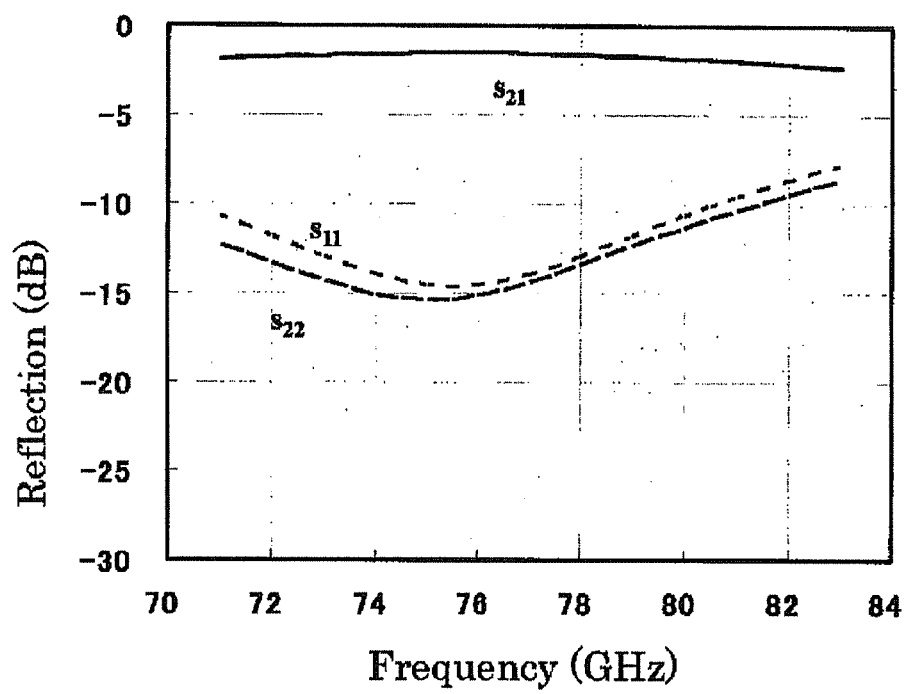
FIG. 27 is a graph of frequency (GHz) vs. the amount of reflection (dB), evidencing the electrical characteristics of the high-frequency module shown in FIGS. 4 and 5.

FIG. 27 is a graph indicating the result of simulation conducted under the above conditions. In the graph, the abscissa axis represents frequencies in GHz and the ordinate axis represents the amounts of reflection in dB. According to the graph shown in FIG. 27, reflection characteristics at the level of about −15 [dB] are observed at frequencies in the vicinity of 75 [GHz], and a band of frequencies corresponding to reflection amounts of −10 [dB] and below exhibits a broadband characteristic spanning about 9 [GHz]. It will be understood from the result that the values of transmission characteristics also stand at adequate level, and accordingly impedance matching can be achieved over a wide frequency range.

Example 3

The electrical characteristics of the high-frequency module 10B according to the third embodiment shown in FIGS. 6 and 7 have been determined by calculation through a simulation based on electromagnetic field analysis.

The following numerical values were adopted as conditions for calculation. The height of the high-frequency component 30 with respect to the conductor plate 21 measured from the upper surface of the waveguide 24 was set to 385 [μm]. The spacing between the signal terminal 31 and each of the reference potential terminals 32 was set to 100 [μm]. The distance between the center of the signal terminal 31 and the center of the slot 20Ba was set to 1.77 [mm]. The dimension of the slot 20Ba was set to 1 [mm]×0.16 [μm]. The cross-sectional dimension of the first conductive wire 41 as well as the second conductive wires 42 and 43 was set to 25 [μm] in diameter. The height of the first conductive wire 41 as well as the second conductive wires 42 and 43 in the z direction measured from the signal terminal 31 or the reference potential terminal 32 was set to 80 [μm]. The distance from a part of the first conductive wire 41 which is connected with the conductor plate 21 to the center of the slot 20Ba was set to 230 [μm]. The positions of connection of the second conductive wires 42 and 43 with the conductor plate 21 relative to the center of the slot 20Ba were (50 [μm], −110 [μm]) and (−50 [μm], −110 [μm]) represented in displacement vector form (x, y). The thickness of the conductor plate 21 was set to 10 [μm]. The width of the waveguide 24 filled with a dielectric body was set to 1.15 [mm]. The thickness of the waveguide 24 was set to 0.45 [mm]. The specific dielectric constant of the dielectric body was set to 9.4. The distance from the center of the slot 20a to the shorted end of the waveguide 24 was set to 0.7 [mm]. And the impedance of the input port 2 composed of the signal terminal 31 and the reference potential terminal 32 was set to 50[Ω]. With the end face of the waveguide 24 acting as a port 1, transmission characteristics and reflection characteristics have been determined by calculation. The parameter $s_{11}$ of the S-Matrix was adopted for the transmission characteristics, and the parameters $s_{11}$ and $s_{22}$ of the S-Matrix were adopted for the reflection characteristics.

Figure 28:
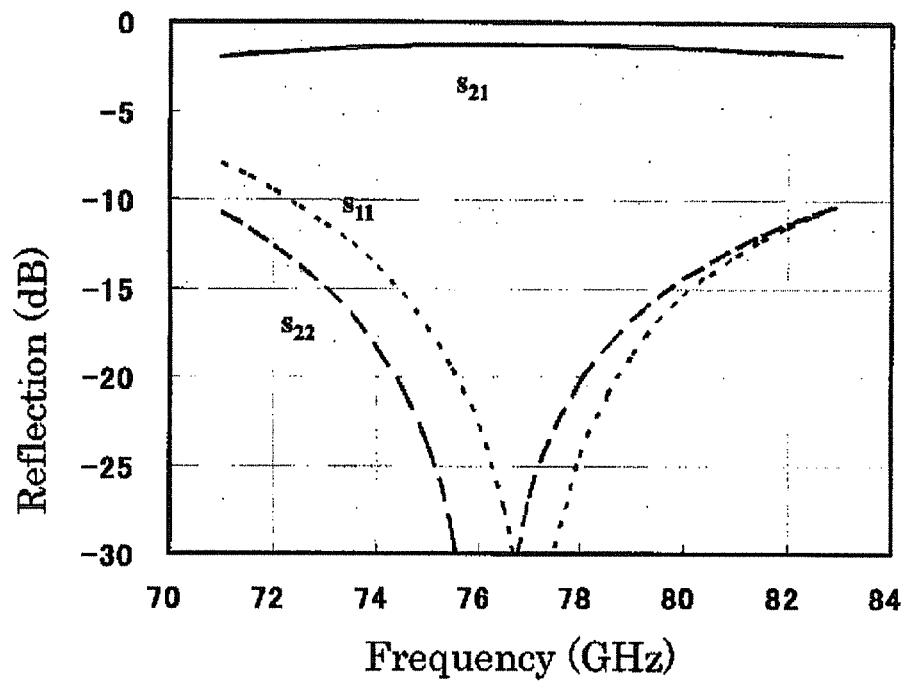
FIG. 28 is a graph of frequency (GHz) vs. the amount of reflection (dB), evidencing the electrical characteristics of the high-frequency module shown in FIGS. 6 and 7.

FIG. 28 is a graph indicating the result of simulation conducted under the above conditions. In the graph, the abscissa axis represents frequencies in GHz and the ordinate axis represents the amounts of reflection in dB. According to the graph shown in FIG. 28, reflection characteristics at the level of −20 [dB] and below are observed at frequencies in the vicinity of 77 [GHz], and a band of frequencies corresponding to reflection amounts of −10 [dB] and below exhibits a broadband characteristic spanning about 10 [GHz]. It will be understood from the result that the values of transmission characteristics also stand at adequate level, and accordingly impedance matching can be achieved over a wide frequency range.

Comparative Example 1

By way of Comparative Example 1, the electrical characteristics of the third embodiment shown in FIGS. 6 and 7 devoid of the second conductive wires 42 and 43 have been determined by calculation through a simulation based on electromagnetic field analysis.

Calculation conditions and parameters of the S-Matrix set for Comparative Example 1 are the same as the conditions and parameters of the S-Matrix set for Example 3, except for the absence of the second conductive wires 43 and 44.

Figure 29:
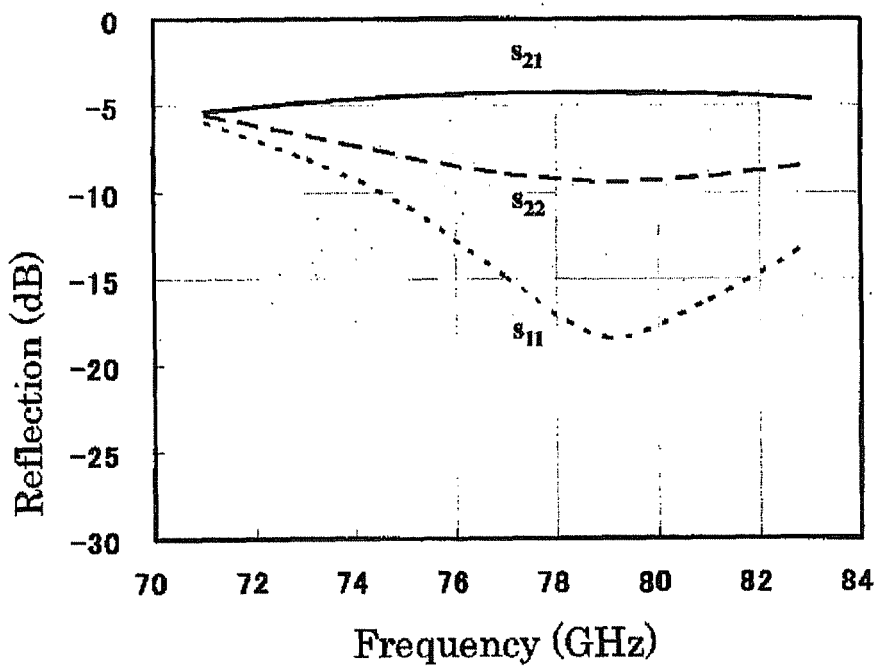
FIG. 29 is a graph of frequency (GHz) vs. the amount of reflection (dB), evidencing the showing electrical characteristics of the high-frequency module of a comparative example.

FIG. 29 is a graph indicating the result of simulation conducted under the above conditions. In the graph, the abscissa axis represents frequencies in GHz and the ordinate axis represents the amounts of reflection in dB. According to the graph shown in FIG. 29, although reflection characteristics at the level of −10 [dB] and below are observed at frequencies in the vicinity of 79 [GHz], transmission characteristics stand at the level of less than −4 [dB]. This is indicative of leakage of electromagnetic waves in the absence of the second conductive wires 42 and 43. Thus, the simulation result has proved the effectiveness of Example 3 having the second conductive wires 42 and 43.

Comparative Example 2

By way of Comparative Example 2, the electrical characteristics of the third embodiment shown in FIGS. 6 and 7 under a condition where the second conductive wires 42 and 43 are disposed to straddle over the slot 20a have been determined by calculation through a simulation based on electromagnetic field analysis.

Calculation conditions and parameters of the S-Matrix set for Comparative Example 2 are the same as the conditions and parameters of the S-Matrix set for Example 3, except that the second conductive wires 42 and 43 are disposed to straddle over the slot 20a and are equal in length to the first conductive wire 41.

Figure 30:
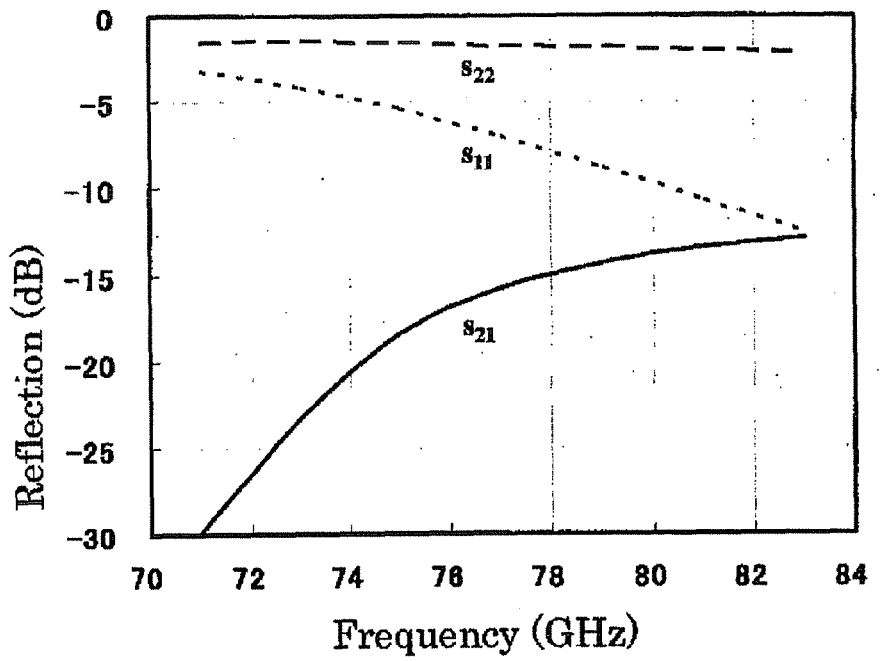
FIG. 30 is a graph of frequency (GHz) vs. the amount of reflection (dB), evidencing the electrical characteristics of the high-frequency module of another comparative example.

FIG. 30 is a graph indicating the result of simulation conducted under the above conditions. In the graph, the abscissa axis represents frequencies in GHz and the ordinate axis represents the amounts of reflection in dB. According to the graph shown in FIG. 30, the values of reflection characteristics defined by $S_{11}$ and $S_{22}$ were increased and there was deterioration in transmission characteristics. This is indicative of a failure of electromagnetic coupling due to a state in which an electric field between the first conductive wire 41 and the second conductive wire 42, 43 becomes parallel to the direction of elongation of the slot 20a. Thus, the simulation result has proved the effectiveness of the construction in which the second conductive wire 42, 43 is placed ahead of the slot 20a and an imaginary line connecting the other end of the second conductive wire 42, 43 with the other end of the first conductive wire 41 crosses over the slot 20a.

REFERENCE SIGNS LIST

10: High-frequency module
20: Slot structure
20a: Slot
21: Conductor plate
21a: Through hole
22: Dielectric body
23: Strip conductor
24: Waveguide
25: Patch electrode
30: High-frequency component
31: Signal terminal
32: Reference potential terminal
33: Signal lead frame
34: Reference potential lead frame
40: Conductive wire
41: First conductive wire
41a: Other end of first conductive wire 41
42, 43: Second conductive wire
42a, 43a: Other end of second conductive wire
45: Base body
46: First conductive wire 47,
48: Second conductive wire
50: Protection member
60: Second slot structure
60a: Slot
61: Laminated body
611: Dielectric layer
62: Slot conductor
63: Upper conductor layer
63a: Through hole
631: First upper conductor layer
632: Second upper conductor layer
64: Lower conductor layer
641: First lower conductor layer
642: Second lower conductor layer
65: Intermediate conductor layer
66: First through conductor group
67: Second through conductor group
68: Third through conductor group
70: Mounting board
71: First substrate
72: Second substrate

The invention claimed is:
1. A high-frequency module, comprising:
a high-frequency circuit comprising a signal terminal configured to be used for at least one of input and output of a high-frequency signal, and at least one reference potential terminal connected to a reference potential;
a conductor comprising a slot and a main surface on which the high-frequency circuit is mounted;
a first conductive wire connected at one end thereof to the signal terminal, the first conductive wire crossing over above the slot and comprising at another end thereof a first connection portion physically connected to the main surface of the conductor; and
at least one second conductive wire connected at one end thereof to the reference potential terminal and being alongside the first conductive wire, the second conductive wire not crossing over above the slot and comprising at another end thereof a second connection portion physically connected to the main surface of the conductor,
wherein the first conductive wire and the second conductive wire electromagnetically couple with each other to form a transmission line for the high-frequency signal, and the transmission line electromagnetically couples the high-frequency circuit with the slot.
2. The high-frequency module according to claim 1, wherein a length of the first conductive wire is an integral multiple of a length equal to one-half of a signal wavelength.

3. The high-frequency module according to claim 1, wherein, when viewed in a direction perpendicular to the main surface of the conductor, an imaginary line connecting the first connection portion with the second connection portion crosses over the slot.

4. The high-frequency module according to claim 1, wherein a distance between the first conductive wire and the second connection portion is smaller than at least one of distances between the first conductive wire and lengthwise ends of the slot.

5. The high-frequency module according to claim 1, wherein an impedance of the slot matches to an impedance consisting of the first connection portion and the second connection portion.

6. The high-frequency module according to claim 1, wherein the first conductive wire and the second conductive wire are each kept in contact with the conductor.

7. The high-frequency module according to claim 1, wherein when viewed in the direction perpendicular to the main surface of the conductor, a direction in which the first conductive wire crosses over the slot is parallel to a direction of an electric field to be generated in the slot.

8. The high-frequency module according to claim 1, wherein
the at least one reference potential terminal is next to the signal terminal, and
when viewed in the direction perpendicular to the main surface of the conductor, the at least one second conductive wire extends along alongside the first conductive wire.

9. The high-frequency module according to claim 8, wherein
the at least one reference potential terminal comprises two reference potential terminals configured to interpose the signal terminal therebetween, and
the at least one second conductive wire comprises two second conductive wires connected to the two reference potential terminals, respectively.

10. The high-frequency module according to claim 9, wherein a distance between the two second conductive wires decreases as the two second conductive wires approach the slot.

11. The high-frequency module according to claim 1, further comprising:
a protection member configured to cover at least above each of the signal terminal, the at least one reference potential terminal, the slot, the first conductive wire, and the at least one second conductive wire.

12. The high-frequency module according to claim 1, wherein the high-frequency circuit is connected, via the slot, to a signal line configured to transmit the high-frequency signal.

13. The high-frequency module according to claim 1, wherein the high-frequency circuit is electromagnetically coupled to a waveguide via the slot.

* * * * *